United States Patent
Liu et al.

(10) Patent No.: US 12,199,081 B2
(45) Date of Patent: Jan. 14, 2025

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Wenqu Liu, Beijing (CN); Feng Zhang, Beijing (CN); Qi Yao, Beijing (CN); Zhao Cui, Beijing (CN); Liwen Dong, Beijing (CN); Zhijun Lv, Beijing (CN); Dongfei Hou, Beijing (CN); Detian Meng, Beijing (CN); Xiaoxin Song, Beijing (CN); Libo Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 684 days.

(21) Appl. No.: 17/299,798

(22) PCT Filed: Aug. 31, 2020

(86) PCT No.: PCT/CN2020/112390
§ 371 (c)(1),
(2) Date: Jun. 4, 2021

(87) PCT Pub. No.: WO2022/041176
PCT Pub. Date: Mar. 3, 2022

(65) Prior Publication Data
US 2022/0310573 A1 Sep. 29, 2022

(51) Int. Cl.
*H01L 25/16* (2023.01)
*G06V 40/13* (2022.01)
(Continued)

(52) U.S. Cl.
CPC ........ *H01L 25/167* (2013.01); *G06V 40/1306* (2022.01); *H10N 39/00* (2023.02);
(Continued)

(58) Field of Classification Search
CPC ....... H01L 25/167; H01L 24/02; H01L 24/03; H01L 24/05; H01L 2224/02331; H01L 2224/02379; G06V 40/1306; H10N 39/00
(Continued)

(56) References Cited

U.S. PATENT DOCUMENTS

2019/0065809 A1  2/2019 Li et al.
2019/0198490 A1* 6/2019 Li .................. H01L 27/124
(Continued)

FOREIGN PATENT DOCUMENTS

CN   106096595 A   11/2016
CN   107195661 A   9/2017
(Continued)

*Primary Examiner* — Ori Nadav
(74) *Attorney, Agent, or Firm* — Ling Wu; Stephen Yang; Ling and Yang Intellectual Property

(57) ABSTRACT

Provided is a display substrate, which includes a base substrate, a circuit structure layer disposed on the base substrate, multiple ultrasonic sensing elements and multiple micro light-emitting elements. The multiple ultrasonic sensing elements are disposed on a side of the circuit structure layer away from the base substrate, and are electrically connected to the circuit structure layer, and the multiple light-emitting elements are disposed on the side of the circuit structure layer away from the base substrate, and are electrically connected to the circuit structure layer. An orthographic projection of the multiple ultrasonic sensing elements on the base substrate does not overlap with an orthographic projection of the multiple micro light-emitting elements on the base substrate.

17 Claims, 19 Drawing Sheets

(51) Int. Cl.
*H10N 39/00* (2023.01)
*H01L 23/00* (2006.01)
(52) U.S. Cl.
CPC .............. *H01L 24/02* (2013.01); *H01L 24/03* (2013.01); *H01L 24/05* (2013.01); *H01L 2224/02331* (2013.01); *H01L 2224/02379* (2013.01); *H01L 2224/02381* (2013.01); *H01L 2224/0239* (2013.01); *H01L 2224/03002* (2013.01); *H01L 2224/05082* (2013.01); *H01L 2224/05147* (2013.01); *H01L 2224/0518* (2013.01); *H01L 2224/05569* (2013.01); *H01L 2224/05573* (2013.01); *H01L 2224/05624* (2013.01); *H01L 2224/05638* (2013.01); *H01L 2224/05639* (2013.01); *H01L 2224/05647* (2013.01); *H01L 2224/05679* (2013.01); *H01L 2224/0568* (2013.01); *H01L 2924/01013* (2013.01); *H01L 2924/01029* (2013.01); *H01L 2924/01041* (2013.01); *H01L 2924/01042* (2013.01); *H01L 2924/01047* (2013.01); *H01L 2924/0106* (2013.01); *H01L 2924/0132* (2013.01)

(58) Field of Classification Search
USPC .......................................................... 257/91
See application file for complete search history.

(56) References Cited

U.S. PATENT DOCUMENTS

2019/0378744 A1* 12/2019 Liu .................... H01L 33/58
2021/0216735 A1   7/2021 Guo et al.

FOREIGN PATENT DOCUMENTS

| CN | 108052930 A | 5/2018 |
| CN | 109614963 A | 4/2019 |
| CN | 110112202 A | 8/2019 |
| WO | 2017168823 A1 | 10/2017 |

* cited by examiner

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application PCT/CN2020/112390 having an international filing date of Aug. 31, 2020, the content of which should be construed as being incorporated herein by reference.

TECHNICAL FIELD

The present disclosure relates to, but is not limited to, the field of display technology, in particular to a display substrate and method for preparing the display substrate, and a display apparatus.

BACKGROUND

With the development of electronic devices and the improvement of users' awareness of personal information protection, more electronic devices are gradually equipped with functions such as fingerprint recognition for unlocking screens of electronic devices or for realizing online payment functions. Nowadays, fingerprint recognition functions are mostly achieved by fingerprint recognition sensors, which are commonly based on ultrasonic waves. For an electronic device based on organic light-emitting diode (OLED) display panel, ultrasonic fingerprint recognition sensors are usually attached to the bottom of the display screen. However, such structure is not conducive to the lightness of electronic equipment since it adds thickness of a display module.

SUMMARY

The following is a summary of subject matter described in detail herein. This summary is not intended to limit the protection scope of the claims.

Embodiments of the present disclosure provide a display substrate, a method for preparing the display substrate, and a display apparatus.

In an aspect, an embodiment of the present disclosure provide a display substrate, which includes a base substrate, a circuit structure layer disposed on the base substrate, multiple ultrasonic sensing elements and multiple micro light-emitting elements; wherein the multiple ultrasonic sensing elements are disposed on a side of the circuit structure layer away from the base substrate, and are electrically connected to the circuit structure layer; and the multiple micro light-emitting elements are disposed on the side of the circuit structure layer away from the base substrate, and are electrically connected to the circuit structure layer. An orthographic projection of the multiple ultrasonic sensing elements on the base substrate does not overlap with an orthographic projection of the multiple micro light-emitting elements on the base substrate.

In some exemplary embodiments, the display substrate further includes a transparent organic insulating layer disposed on a side of the multiple micro light-emitting elements away from the base substrate; the transparent organic insulating layer covers the multiple micro light-emitting elements. The multiple ultrasonic sensing elements each include a piezoelectric functional layer. The transparent organic insulating layer is in direct contact with the piezoelectric functional layers of the multiple ultrasonic sensing elements, and an orthographic projection of the transparent organic insulating layer on the base substrate does not overlap with an orthographic projection of the piezoelectric functional layers of the multiple ultrasonic sensing elements on the base substrate.

In some exemplary embodiments, at least one of the multiple ultrasonic sensing elements further includes a transmit electrode and a receive electrode. The transmit electrode is located on a side of the piezoelectric functional layer away from the base substrate; the receive electrode is located on a side of the piezoelectric functional layer close to the base substrate, and is electrically connected to the circuit structure layer.

In some exemplary embodiments, the transmit electrode is in direct contact with the piezoelectric functional layer, and an insulating layer is disposed between the receive electrode and the piezoelectric functional layer.

In some exemplary embodiments, the circuit structure layer includes multiple first light-emitting drive circuits and multiple ultrasonic detection circuits; the multiple ultrasonic detection circuits are connected to the multiple ultrasonic sensing elements in one-to-one correspondence; and the multiple first light-emitting drive circuits are connected to the multiple micro light-emitting elements in one-to-one correspondence. Or, the circuit structure layer includes multiple second light-emitting drive circuits having an ultrasonic detection function, wherein the multiple second light-emitting drive circuits are connected to the multiple ultrasonic sensing elements and the micro light-emitting elements in one-to-one correspondence.

In some exemplary embodiments, the circuit structure layer further includes multiple common electrode lines. At least one of the multiple micro light-emitting elements includes a light-emitting part, and a first electrode and a second electrode which are connected to the light-emitting part. The first electrode is electrically connected to a corresponding first light-emitting drive circuit or a corresponding second light-emitting drive circuit, and the second electrode is electrically connected to a common electrode line.

In some exemplary embodiments, the display substrate further includes multiple first connection electrodes and multiple second connection electrodes. The first electrode of the at least one micro light-emitting element is electrically connected to the corresponding first light-emitting drive circuit or the corresponding second light-emitting drive circuit through the first connection electrode, and the second electrode of the at least one micro light-emitting element is electrically connected to the common electrode line through the second connection electrode.

In some exemplary embodiments, the multiple first connection electrodes and the multiple second connection electrodes and the receive electrode of the at least one ultrasonic sensing element are disposed in a same layer.

In some exemplary embodiments, the base substrate includes a display region and an ultrasonic sensing region located on a side of the display region; the multiple ultrasonic sensing elements are located in the ultrasonic sensing region, and the multiple micro light-emitting elements are located in the display region. Or, the base substrate includes a display region, and the multiple ultrasonic sensing elements and the multiple micro light-emitting elements are regularly disposed in the display region.

In some exemplary embodiments, the base substrate further includes a bonding region located on a side of the display region; the bonding region includes multiple bonding electrode s; the multiple bonding electrodes and the circuit structure layer are located on a same side of the base substrate, or the multiple bonding electrodes and the circuit structure layer are located on different sides of the base substrate.

In some exemplary embodiments, the multiple bonding electrodes and the circuit structure layer are located on different sides of the base substrate, and the bonding region further includes a fan-out lead layer located on the same side of the base substrate as the circuit structure layer. The fan-out lead layer includes multiple fan-out leads, and at least one of the multiple fan-out leads is connected to at least one of the bonding electrodes through a via hole penetrating through the base substrate.

In some exemplary embodiments, the circuit structure layer includes an active layer, a first gate metal layer, a second gate metal layer and a source and drain metal layer which are sequentially disposed on the base substrate; a first gate insulating layer is disposed between the active layer and the first gate metal layer, a second gate insulating layer is disposed between the first gate metal layer and the second gate metal layer, and an interlayer dielectric layer is disposed between the second gate metal layer and the source and drain metal layer.

In some exemplary embodiments, the multiple bonding electrodes and the circuit structure layer are located on the same side of the base substrate, and the multiple bonding electrodes and the source and drain metal layer are disposed in a same layer.

In another aspect, an embodiment of the present disclosure provides a display apparatus, which includes the display substrate described above.

In another aspect, an embodiment of the disclosure provides a method for preparing a display substrate, including: forming a circuit structure layer on the base substrate; forming multiple micro light-emitting elements and multiple ultrasonic sensing elements on a side of the circuit structure layer away from the base substrate. The multiple micro light-emitting elements are electrically connected to the circuit structure layer and the multiple ultrasonic sensing elements are electrically connected to the circuit structure layer, and an orthographic projection of the multiple ultrasonic sensing elements on the base substrate does not overlap with an orthographic projection of the multiple micro light-emitting elements on the base substrate.

In some exemplary embodiments, method for preparing a display substrate further includes: forming a transparent organic insulating layer covering the multiple micro light-emitting elements on a side of the multiple micro light-emitting elements away from the base substrate. Herein, the multiple ultrasonic sensing elements each include a piezoelectric functional layer; the transparent organic insulating layer is in direct contact with the piezoelectric functional layer of the ultrasonic sensing element, and an orthographic projection of the transparent organic insulating layer on the base substrate does not overlap with an orthographic projection of the piezoelectric functional layers of the multiple ultrasonic sensing elements on the base substrate.

In some exemplary embodiments, forming the multiple micro light-emitting elements and the multiple ultrasonic sensing elements on a side of the circuit structure layer away from the base substrate includes: forming multiple first connection electrodes, multiple second connection electrodes and receive electrodes of the multiple ultrasonic sensing elements on the side of the circuit structure layer away from the base substrate; forming multiple micro light-emitting elements on a side of the multiple first connection electrodes and the multiple second connection electrodes away from the base substrate through a transfer process; forming the piezoelectric functional layers of the multiple ultrasonic sensing elements on a side of the receive electrodes of the multiple ultrasonic sensing elements away from the base substrate; and forming transmit electrodes of the multiple ultrasonic sensing elements on a side of the piezoelectric functional layers away from the base substrate. Herein, the multiple first connection electrodes, the multiple second connection electrodes and the receive electrodes are connected to the circuit structure layer. A first electrode of at least one micro light-emitting element is electrically connected to a first connection electrode, and a second electrode of at least one micro light-emitting element is electrically connected to a second connection electrode.

In some exemplary embodiments, forming the piezoelectric functional layers of the multiple ultrasonic sensing elements on the side of the receive electrodes of the multiple ultrasonic sensing elements away from the base substrate includes: performing self-aligned polarization treatment on the piezoelectric functional layers using the transparent organic insulating layer; or, polarizing the piezoelectric functional layers using a mask and the transparent organic insulating layer.

In some exemplary embodiments, the method for preparing the display substrate further includes: forming multiple bonding electrodes on a de-bonding layer; forming the base substrate on a side of the multiple bonding electrodes away from the de-bonding layer; and forming a fan-out lead layer on the base substrate. The fan-out lead layer includes multiple fan-out leads, and at least one of the multiple fan-out leads is connected to at least one of the bonding electrodes through a via hole penetrating through the base substrate.

In some exemplary embodiments, forming the circuit structure layer on the base substrate includes: sequentially forming an active layer, a first gate insulating layer, a first gate metal layer, a second gate insulating layer, a second gate metal layer, an interlayer dielectric layer and a source and drain metal layer on the base substrate.

Other aspects will become apparent after the drawings and the detailed description are read and understood.

BRIEF DESCRIPTION OF DRAWINGS

Accompanying drawings are used to provide a further understanding of technical solutions of the present disclosure and form a part of the description to explain the technical solutions of the present disclosure together with embodiments of the present disclosure, which do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
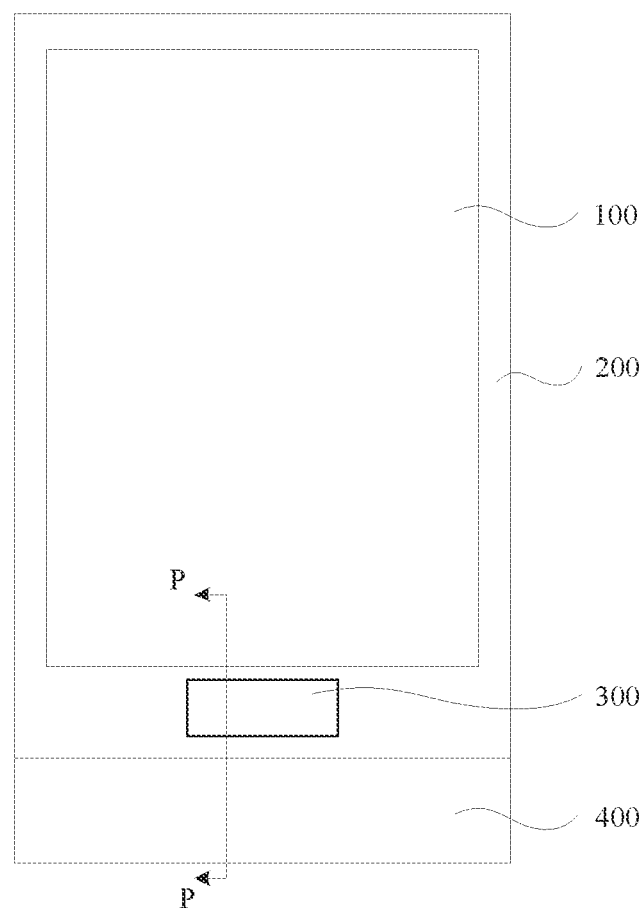
FIG. 1 is a schematic diagram of a display substrate according to at least one embodiment of the present disclosure.

In order to make objects, technical solutions and advantages of the present disclosure more clear, embodiments of the present disclosure will be described in detail below with reference to the accompanying drawings. The embodiments may be implemented in a number of different forms. Those of ordinary skills in the art will readily understand the fact that implementations and contents may be transformed into one or more of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, size of one or more constituent elements, or thickness or area of a layer, is sometimes exaggerated for clarity. Therefore, an embodiment of the present disclosure is not necessarily limited to the size, and shapes and dimensions of multiple components in the drawings do not reflect real scales. In addition, the drawings schematically show ideal examples, and an implementation of the present disclosure is not limited to the shapes or numerical values shown in the drawings.

The "first", "second", "third" and other ordinal numbers in the present disclosure are used to avoid confusion of constituent elements, not to provide any quantitative limitation. In the description of the present disclosure, "multiple" means two or more counts.

In the present disclosure, for the sake of convenience, wordings such as "central", "upper", "lower", "front", "rear", "vertical", "horizontal", "top", "bottom", "inner", "outer" and the others describing the orientations or positional relations are used to depict relations of elements with reference to the drawings, which are only for an easy and simplified description of the present disclosure, rather than for indicating or implying that the device or element referred to must have a specific orientation, or must be constructed and operated in a particular orientation and therefore, those wordings cannot be construed as limitations on the present disclosure. The positional relations of the elements are appropriately changed according to the direction in which the elements are described. Therefore, they are not limited to the wordings in the specification, and may be replaced appropriately according to the situations.

In the present disclosure, the terms "installed", "connected" and "coupled" shall be understood in their broadest sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the present disclosure, a transistor refers to an element including at least three terminals, namely, a gate electrode, a drain electrode and a source electrode. The transistor has a channel region between the drain electrode (a drain electrode terminal, a drain region or a drain electrode) and the source electrode (a source electrode terminal, a source region or a source electrode), and a current may flow through the drain electrode, the channel region and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. The functions of the "source electrode" and that of the "drain electrode" are interchangeable under circumstances where transistors with opposite polarities are used or where the current direction changes during circuit operation. Therefore, in the present disclosure, "the source electrode" and "the drain electrode" are interchangeable.

In the present disclosure, "an electrical connection" includes a case where constituent elements are connected via an element having a certain electrical action. The "element having a certain electrical action" is not particularly limited as long as it can transmit and receive electrical signals between the connected constituent elements. Examples of the "element having a certain electrical action" not only include electrodes and wirings, but also include switching elements such as transistors, resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes "conductive layer" may be replaced by "conductive film". Similarly, "insulating film" may sometimes be replaced by "insulating layer".

In the present specification, "about" means that there is not strict limit for a value, and values within an error range during processes and measurement are allowed.

At least one embodiment of the present disclosure provides a display substrate, which includes a base substrate, a circuit structure layer disposed on the base substrate, multiple ultrasonic sensing elements and multiple micro light-emitting elements. The multiple ultrasonic sensing elements are disposed on a side of the circuit structure layer away from the base substrate, and are electrically connected to the circuit structure layer. The multiple micro light-emitting elements are disposed on a side of the circuit structure layer away from the base substrate, and are electrically connected to the circuit structure layer. An orthographic projection of the multiple ultrasonic sensing elements on the base substrate does not overlap with an orthographic projection of the multiple micro light-emitting elements on the base substrate.

In some examples, a micro light-emitting element may be a micro light-emitting diode (Micro-LED) or a mini-LED.

In the present embodiment, the ultrasonic sensing elements and the corresponding circuit structure are integrated into the display substrate using the micro light-emitting element, which can reduce the module thickness. Since the ultrasonic sensing elements are close to an ultrasonic detection interface, ultrasonic signals can be detected by the ultrasonic sensing elements without passing through the circuit structure. In this way, loss of the ultrasonic signals can be reduced, and the signal-to-noise ratio as well as the quality of ultrasonic detection can be improved.

In some exemplary embodiments, the display substrate further includes a transparent organic insulating layer disposed on a side of the multiple micro light-emitting elements away from the base substrate. The transparent organic insulating layer covers the multiple micro light-emitting elements. The multiple ultrasonic sensing elements each include a piezoelectric functional layer. The transparent organic insulating layer is in direct contact with the piezoelectric functional layers of the multiple ultrasonic sensing elements, and an orthographic projection of the transparent organic insulating layer on the base substrate does not overlap with an orthographic projection of the piezoelectric functional layers of the multiple ultrasonic sensing elements on the base substrate. In an exemplary embodiment, by providing a transparent organic insulating layer covering multiple micro light-emitting elements, the micro light-emitting elements can be encapsulated and protected without reducing light transmittance, which ensures the display effect. Furthermore, during a polarization process of the piezoelectric functional layers of the ultrasonic sensor elements, the transparent organic insulating layers can protect transistors in the circuit structure layer from being damaged or penetrated by a polarized electric field.

In some exemplary embodiments, at least one of the multiple ultrasonic sensing elements further includes a transmit electrode and a receive electrode. The transmit electrode is located on a side of a piezoelectric functional layer away from the base substrate, the receive electrode is located on a side of the piezoelectric functional layer close to the base substrate, and the receive electrode is electrically connected to the circuit structure layer. In an exemplary embodiment, transmission and reception of ultrasonic signals are achieved by the same piezoelectric functional layer, which is beneficial to simplifying the structure.

In some exemplary embodiments, the transmit electrode is in direct contact with the piezoelectric functional layer, and an insulating layer is disposed between the receive electrode and the piezoelectric functional layer.

In some exemplary embodiments, the circuit structure layer includes multiple first light-emitting drive circuits and multiple ultrasonic detection circuits. The multiple ultrasonic detection circuits are connected to the multiple ultrasonic sensing elements in one-to-one correspondence, and the first multiple light-emitting drive circuits are connected to the multiple micro light-emitting elements in one-to-one correspondence. Or, the circuit structure layer includes multiple second light-emitting drive circuits having an ultrasonic detection function, which are connected to the multiple ultrasonic sensing elements and the multiple micro light-emitting elements in one-to-one correspondence. However, this is not limited in the present embodiment.

In some exemplary embodiments, the circuit structure layer further includes multiple common electrode lines. At least one of the multiple micro light-emitting elements includes a light-emitting part, a first electrode and a second electrode connected to a light-emitting part. The first electrode is electrically connected to a corresponding first light-emitting drive circuit or second light-emitting drive circuit, and the second electrode is electrically connected to a common electrode line. In some examples, the first electrode may be an anode and a second electrode may be a cathode. However, this is not limited in the present embodiment.

In some exemplary embodiments, the display substrate may further include multiple first connection electrodes and multiple second connection electrodes. A first electrode of at least one micro light-emitting element is electrically connected to the corresponding first light-emitting drive circuit or second light-emitting drive circuit through a first connection electrode, and a second electrode of the at least one micro light-emitting element is electrically connected to a common electrode line through a second connection electrode. However, this is not limited in the present embodiment. In some examples, a first electrode of at least one micro light-emitting element may be directly electrically connected to the corresponding first or second light-emitting drive circuit, and a second electrode of at least one micro light-emitting element may be directly electrically connected to a common electrode line.

In some exemplary embodiments, the multiple first connection electrodes and the multiple second connection electrodes and a receive electrode of the at least one ultrasonic sensing element may be disposed in a same layer. However, this is not limited in the present embodiment.

In some exemplary embodiments, the base substrate includes a display region and an ultrasonic sensing region located on a side of the display region. Multiple ultrasonic sensing elements are located in the ultrasonic sensing region, and multiple micro light-emitting elements are located in the display region. Or, the base substrate includes a display region, and multiple ultrasonic sensing elements and multiple micro light-emitting elements are regularly disposed in the display region. In some examples, multiple ultrasonic sensing elements may be disposed in a separate ultrasonic sensing region for achieving fingerprint recognition in the ultrasonic sensing region and for achieving display in the display region. In some examples, the multiple ultrasonic sensing elements may correspond to the multiple micro light-emitting elements one by one and are all disposed in the display region, and the display function and the fingerprint recognition function are integrated in the display region. However, this is not limited in the present embodiment.

In some exemplary embodiments, the base substrate may further include a bonding region located on a side of the display region. The bonding region includes multiple bonding electrodes. The multiple bonding electrodes and the circuit structure layer are located on the same side of the base substrate, or the multiple bonding electrodes and the circuit structure layer are located on different sides of the base substrate. In some examples, the circuit structure layer is located on a front side of the base substrate, and the multiple bonding electrodes are located on a back side of the base substrate; or, the circuit structure layer and the multiple bonding electrodes are all located on the front surface of the base substrate. However, this is not limited in the present embodiment.

In some exemplary embodiments, the multiple bonding electrodes and the circuit structure layer are located on different sides of the base substrate, and the bonding region further may include a fan-out lead layer located on the same side of the base substrate as the circuit structure layer. The fan-out lead layer includes multiple fan-out leads, and at least one of the multiple fan-out leads is connected to at least one of the bonding electrodes through a via hole penetrating through the base substrate.

In some exemplary embodiments, the circuit structure layer includes: an active layer, a first gate metal layer, a second gate metal layer and a source and drain metal layer which are sequentially disposed on the base substrate. A first gate insulating layer is disposed between the active layer and the first gate metal layer, a second gate insulating layer is disposed between the first gate metal layer and the second gate metal layer, and an interlayer dielectric layer is disposed between the second gate metal layer and the source and drain metal layer.

In some exemplary embodiments, the multiple bonding electrodes and the circuit structure layer are located on a same side of the base substrate, and the multiple bonding electrodes and the source and drain metal layer are disposed in a same layer. However, this is not limited in the present embodiment.

FIG. 1 is a schematic diagram of a display substrate according to at least one embodiment of the present disclosure. As shown in FIG. 1, the display substrate according to this exemplary embodiment includes a display region 100, a peripheral region 200 located around the display region 100, an ultrasonic sensing region 300 located in the peripheral region 200 on a side of the display region 100, and a bonding region 400 located on a side of the ultrasonic sensing region 300 away from the display region 100. The display region 100 is provided therein with multiple display units disposed regularly. At least one of the display units includes a micro light-emitting element and a light-emitting drive circuit configured to drive the micro light-emitting element to emit light. In some examples, the micro light-emitting element may be a Micro-LED or a Mini-LED. The ultrasonic sensing region 300 is provided therein with multiple ultrasonic sensing units disposed regularly. At least one of the ultrasonic sensing units includes an ultrasonic sensing element configured to transmit and receive an ultrasonic signal, and an ultrasonic detection circuit configured to detect an ultrasonic signal. The peripheral region 200 is provided with a control circuit for driving the display units to emit light. The bonding region 400 is provided with multiple bonding electrodes which are bonded and connected to an external circuit board (e.g. a flexible printed circuit (FPC)). In some examples, a processing circuit is disposed on the circuit board, wherein the processing circuit may be configured to provide an ultrasonic control signal (e.g., a high-frequency electric signal or an alternating-current electric signal) to the ultrasonic sensing element to enable the ultrasonic sensing element to emit an ultrasonic signal. The processing circuit is also configured to receive a fingerprint electrical signal collected by the ultrasonic detection circuit to identify a fingerprint.

Figure 2:
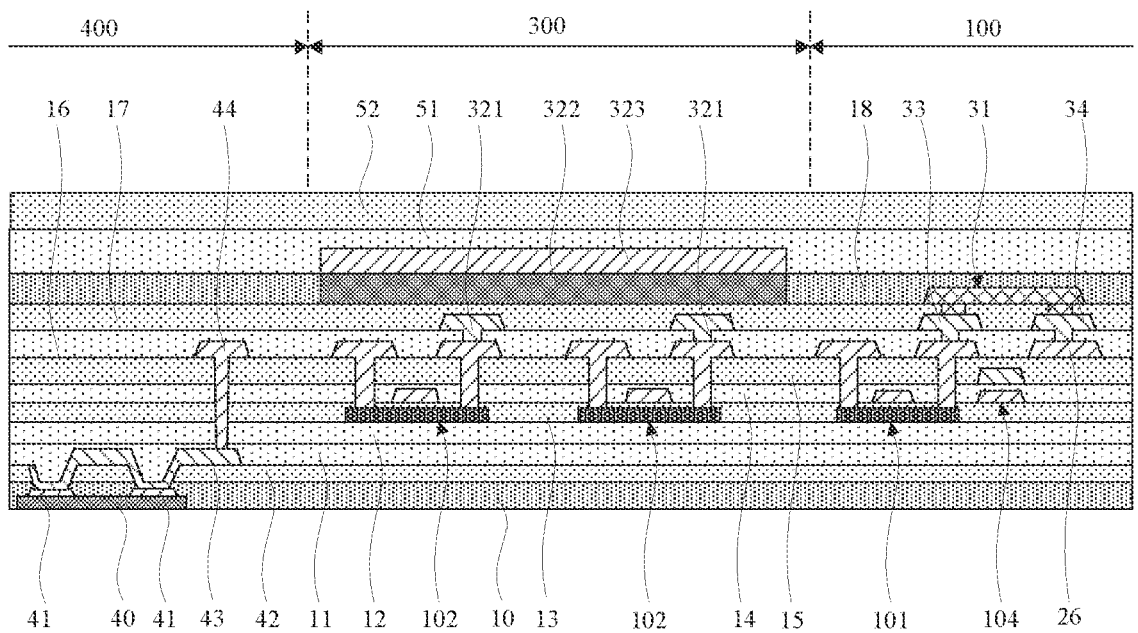
FIG. 2 is a schematic sectional view along P-P direction in FIG. 1.

FIG. 2 is a schematic sectional view along P-P direction in FIG. 1. As shown in FIG. 2, in a plane perpendicular to the display substrate, the display region 100 of the display substrate includes: a base substrate 10, a passivation layer 42, a first insulating layer 11, a second insulating layer 12 and a circuit structure layer which are sequentially disposed on the base substrate 10, multiple micro light-emitting elements (only one micro light-emitting element 31 is illustrated in FIG. 2) disposed on a circuit structure layer, a transparent organic insulating layer 18 covering the multiple micro light-emitting elements, an adhesive layer 51 covering the transparent organic insulating layer 18, and a cover plate 52. The circuit structure layer of the display region 100 includes multiple first light-emitting drive circuits and multiple common electrode lines (only one common electrode line 26 is illustrated in FIG. 2), wherein the multiple first light-emitting drive circuits and the multiple micro light-emitting elements are in one-to-one correspondence At least one of the first light-emitting drive circuits may include multiple transistors and at least one storage capacitor. For example, the first light-emitting drive circuit may be designed as 8T2C (i.e., eight thin film transistors and two capacitors) or 13T1C (i.e., thirteen thin film transistors and one capacitor). In FIG. 2, one first thin film transistor 101 and one first storage capacitor 104 are illustrated as an example. The circuit structure layer of the display region 100 may include: an active layer, a third insulating layer 13, a first gate metal layer, a fourth insulating layer 14, a second gate metal layer, a fifth insulating layer 15, and a source and drain metal layer sequentially disposed on the second insulating layer 12. The active layer may at least include a first active layer, the first gate metal layer may at least include a first gate electrode and a first capacitor electrode, the second gate metal layer may at least include a second capacitor electrode, and the source and drain metal layer may at least include a first source electrode, a first drain electrode and the common electrode line 26. The first active layer, the first gate electrode, the first source electrode and the first drain electrode form the first thin film transistor 101, and the first capacitor electrode and the second capacitor electrode form the first storage capacitor 104. The micro light-emitting element 31 may include a light-emitting part, and a first electrode and a second electrode which are connected to the light-emitting part. The first electrode is connected to a first end of the light-emitting part, and the second electrode is connected to a second end of the light-emitting part. In some examples, the first electrode of the micro light-emitting element 31 may be an anode and the second electrode may be a cathode. The display region 100 further includes multiple first connection electrodes and multiple second connection electrodes (one first connection electrode 33 and one second connection electrode 34 are illustrated in FIG. 2). The first electrode of the micro light-emitting element 31 may be connected to the first drain electrode of the first thin film transistor 101 through the first connection electrode 33, and the second electrode of the micro light-emitting element 31 may be connected to the common electrode line 26 through the second connection electrode 34.

In some exemplary embodiments, as shown in FIG. 2, in a plane perpendicular to the display substrate, the ultrasonic sensing region 300 of the display substrate includes a base substrate 10, a passivation layer 42, a first insulating layer 11, a second insulating layer 12, and a circuit structure layer which are sequentially disposed on the base substrate 10, multiple ultrasonic sensor elements disposed on the circuit structure layer (two ultrasonic sensing elements are illustrated in FIG. 2), an adhesive layer 51 covering the multiple ultrasonic sensing elements and a cover plate 52. The circuit structure layer of the ultrasonic sensing region 300 includes multiple ultrasonic detection circuits, which correspond to the multiple ultrasonic sensing elements one by one. An ultrasonic detection circuit may include multiple transistors, for example, it may be designed as 4T (i.e., four thin film transistors) or 5T (i.e., five thin film transistors). In FIG. 2, two ultrasonic detection circuits are taken as an example for illustration, wherein only one second thin film transistor 102 is taken as example in each ultrasonic detection circuit. The circuit structure layer of the ultrasonic sensing region 300 may include: an active layer, a third insulating layer 13, a first gate metal layer, a fourth insulating layer 14, a fifth insulating layer 15, and a source and drain metal layer which are sequentially disposed on the second insulating layer 12. The active layer may at least include a second active layer, the first gate metal layer may at least include a second gate electrode, and the source and drain metal layer may at least include a second source electrode and a second drain electrode. The second active layer, the second gate electrode, the second source electrode and the second drain electrode form the second thin film transistor 102. An ultrasonic sensing element may include a receive electrode 321, a piezoelectric functional layer 322 and a transmit electrode 323. The receive electrode 321 and a first connection electrode 33 and a second connection electrode 34 of the display region 100 may be disposed in a same layer. Piezoelectric functional layers 322 of the multiple ultrasonic sensing elements may be in an integrated structure, and transmit electrodes 323 of the multiple ultrasonic sensing elements may be in an integrated structure, for example, the transmit electrodes 323 may be sheet electrodes. An orthographic projection of the transmit electrode 323 on base substrate 10 may cover an orthographic projection of the multiple receive electrodes 321 on base substrate 10, and an orthographic projection of the piezoelectric functional layer 322 on base substrate 10 may cover an orthographic projection of the multiple receive electrodes 321 on base substrate 10. The piezoelectric functional layer 322 may be configured to emit an ultrasonic signal and receive an ultrasonic signal reflected by a sensing object (e.g., a finger). The receive electrodes 321 may be disposed on a side of the piezoelectric functional layer 322 close to the base substrate 10, and the transmit electrode 323 may be disposed on a side of the piezoelectric functional layer 322 away from the base substrate 10. The transmit electrode 323 is in direct contact with the piezoelectric functional layer 322, and a seventh insulating layer 17 is provided between the receive electrodes 321 and the piezoelectric functional layer 322. The receive electrodes 321 may be connected to the second drain electrodes of the second thin film transistors 102 of the ultrasonic detection circuits. The transmit electrode 323 may be connected to an ultrasonic control terminal (not shown in the figure) to receive an ultrasonic control signal provided by the ultrasonic control terminal.

In this exemplary embodiment, the piezoelectric functional layer 322 may utilize a piezoelectric effect (which is categorized into a positive piezoelectric effect and an inverse piezoelectric effect) of a piezoelectric material after crystallization and electric field polarization to achieve the transmission and reception of ultrasonic signals. In some examples, when the ultrasonic control signal received by the transmit electrode 323 via the ultrasonic control terminal is an alternating voltage, the piezoelectric functional layer 322 may generate ultrasonic signals under the action of the voltage signal provided by the transmit electrode 323, which process is an inverse piezoelectric effect. When the ultrasonic signal generated by the piezoelectric functional layer 323 encounters a finger, due to the existence of valleys and ridges on surface of the finger fingerprint, reflection interfaces of the ultrasonic signal are different. Among them, the valleys correspond to an air interface, which has a large impedance to ultrasonic signals, and the amount of ultrasonic signals passing through the air interface is small, so the intensity of reflected ultrasonic signals is stronger; while ridges correspond to a solid interface, which has less impedance to ultrasonic signals and more ultrasonic signals passes through solid interface, so the intensity of reflected ultrasonic signal is lower. When the ultrasonic signals reflected by the air interface and the solid interface are received by the piezoelectric functional layer 322, a positive piezoelectric effect will be generated in the piezoelectric functional layer 322, and multiple local charge accumulations will be generated on the surface of the piezoelectric functional layer 322, and the quantity of each local charge accumulation is positively correlated with the intensity of the received reflected ultrasonic signal. After the local charges are accumulated, a coupling voltage will be generated on the receive electrode 321 through coupling action. The receive electrode 321 is connected to an ultrasonic detection circuit, and the detected fingerprint electrical signal is transmitted to a processing circuit in a circuit board through the ultrasonic detection circuit, so that the fingerprint electrical signal is processed to obtain an image reflecting fingerprint information. In an exemplary embodiment, the transmission and reception of ultrasonic signals may be achieved by the same piezoelectric functional layer. However, this is not limited in the present embodiment. In some examples, the ultrasonic sensing element may include an ultrasonic transmitting element and an ultrasonic receiving element, and different piezoelectric functional layers are used for achieving transmission and reception of ultrasonic signals respectively.

In some exemplary embodiments, as shown in FIG. 2, in a plane perpendicular to the display substrate, the bonding region 400 of the display substrate includes: a de-bonding layer 40, multiple bonding electrodes 41 disposed on the de-bonding layer 40, a base substrate 10 covering the de-bonding layer 40, and a passivation layer 42, a fan-out lead layer, a first insulating layer 11, a second insulating layer 12, a third insulating layer 13, a fourth insulating layer 14, a fifth insulating layer 15, a sixth insulating layer 16, a seventh insulating layer 17, the transparent organic insulating layer 18, an adhesive layer 51 and a cover plate 52 which are sequentially disposed on the base substrate 10. The fan-out lead layer includes multiple fan-out leads (only one fan-out lead 43 is illustrated in FIG. 2). The fan-out lead 43 is connected to at least one of the bonding electrodes (e.g., two bonding electrodes 41) through a via hole on the base substrate 10 and the passivation layer 42. The bonding region 400 further includes multiple fan-out connection electrodes (only one fan-out connection electrode 44 is illustrated in FIG. 2). The fan-out connection electrode 44 is disposed in a same layer as the source and drain metal layer in the display region 100 and the ultrasonic sensing region 300. The fan-out connection electrode 44 may be connected to the fan-out lead 43 through a via hole on the fifth insulating layer 15, the fourth insulating layer 14, the third insulating layer 13, the second insulating layer 12 and the first insulating layer 11. In some examples, the multiple bonding electrodes 41 may be configured to provide data signals and power signals to the first light-emitting drive circuits of the display region 100 through the fan-out lead 43 and the fan-out connection electrode 44, provide various voltage signals to the ultrasonic detection circuits of the ultrasonic sensing region 300, provide ultrasonic control signals to the transmit electrode 323 of the ultrasonic sensing region 300, and to transmit fingerprint electrical signals detected by the ultrasonic detection circuits to an external circuit board. However, this is not limited in the present embodiment.

Figure 3:
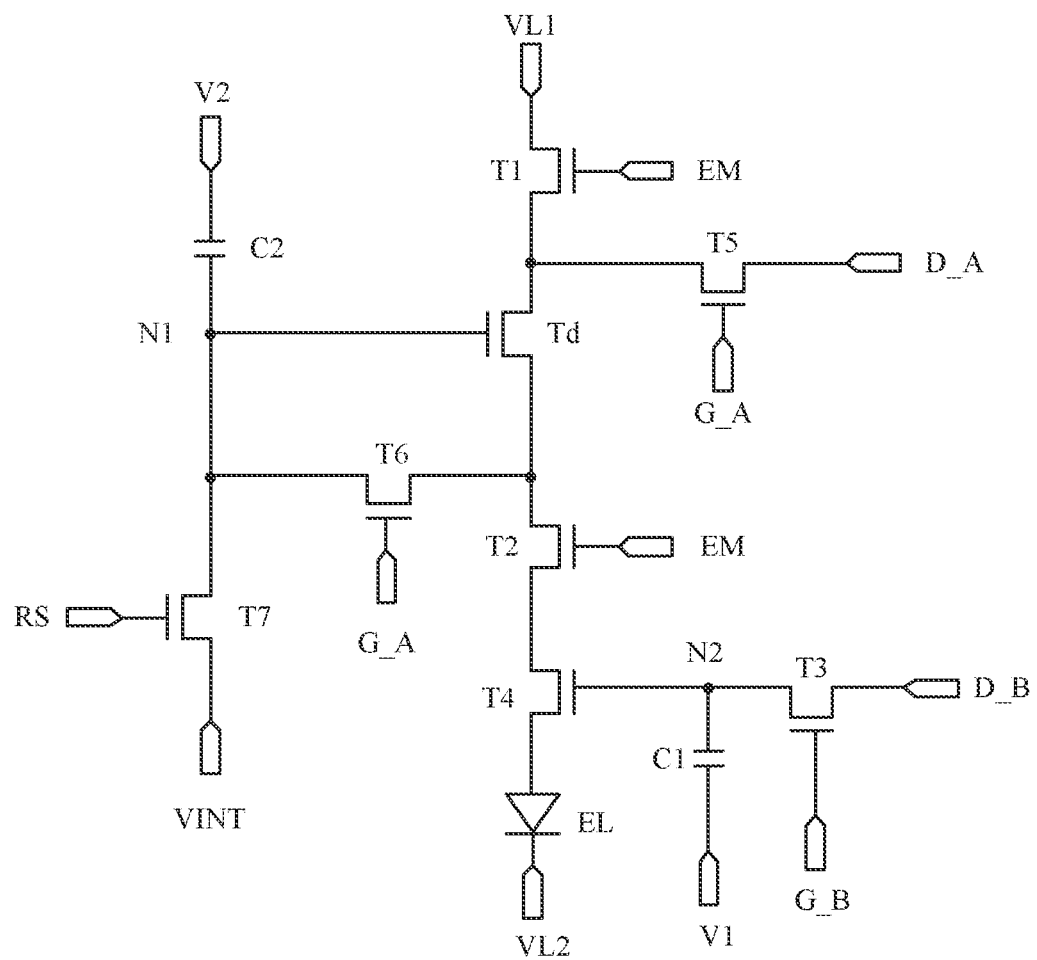
FIG. 3 is an equivalent circuit diagram of a first light-emitting drive circuit according to at least one embodiment of the present disclosure.
Figure 4:
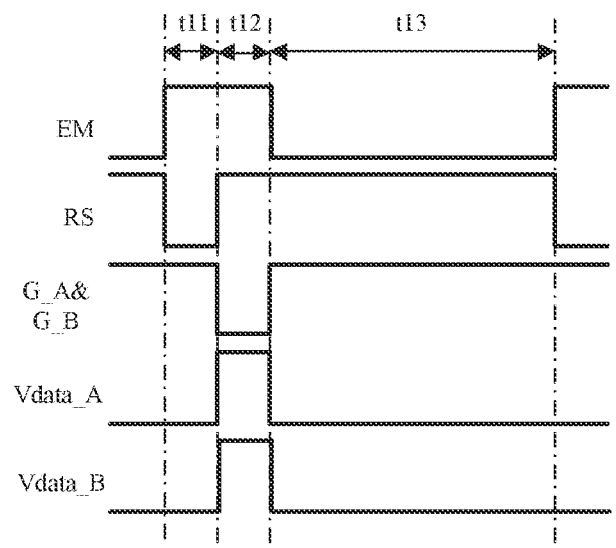
FIG. 4 is an operating timing diagram of the first light-emitting drive circuit provided in FIG. 3.

FIG. 3 is an equivalent circuit diagram of a first light-emitting drive circuit according to at least one embodiment of the present disclosure. FIG. 4 is an operating timing diagram of the first light-emitting drive circuit provided in FIG. 3. As shown in FIG. 3, the first light-emitting drive circuit according to this exemplary embodiment may include a drive transistor Td, first to seventh transistors T1 to T7, a first capacitor C1 and a second capacitor C2. A gate electrode of the first transistor T1 is connected to a light-emitting control terminal EM, a first electrode of the first transistor T1 is connected to a first operation voltage terminal VL1, and a second electrode of the first transistor T1 is connected to a first electrode of the drive transistor Td. A gate electrode of the second transistor T2 is connected to the light-emitting control terminal EM, a first electrode of the second transistor T2 is connected to a second electrode of the drive transistor Td, and a second electrode of the second transistor T2 is connected to a first electrode of the fourth transistor T4. A gate electrode of the third transistor T3 is connected to a second scanning signal terminal G_B, a first electrode of the third transistor T3 is connected to a second data signal terminal D_B, and a second electrode of the third transistor T3 is connected to a gate electrode of the fourth drive transistor T4. A second electrode of the fourth transistor T4 is connected to a first electrode of a micro light-emitting element EL. A gate electrode of the fifth transistor T5 is connected to the first scanning signal terminal G_A, a first electrode of the fifth transistor T5 is connected to the first electrode of the drive transistor Td, and a second electrode of the fifth transistor T5 is connected to a first data signal terminal D_A. A gate electrode of the sixth transistor T6 is connected to a first scanning signal terminal G_A, a first electrode of the sixth transistor T6 is connected to a gate electrode of the drive transistor Td, and a second electrode of the sixth transistor T6 is connected to a second electrode of the drive transistor Td. A gate electrode of the seventh transistor T7 is connected to a reset control signal terminal RS, a first electrode of the seventh transistor T7 is connected to the gate electrode of the drive transistor Td, and a second electrode of the seventh transistor T7 is connected to a reset voltage terminal VINT. A first terminal of the first capacitor C1 is connected to the second electrode of the third transistor T3, and a second terminal of the first capacitor C2 is connected to a first voltage terminal V1. A first terminal of the second capacitor C2 is connected to the gate electrode of the drive transistor Td, and a second terminal of the second capacitor C2 is connected to a second voltage terminal V2. A second electrode of the micro light-emitting element EL is connected to a second operation voltage terminal VL2.

With reference to FIG. 4, taking the first transistors T1 to T7 and the drive transistor Td being P-type transistors as an example, the working process of the first light-emitting drive circuit in an image frame will be explained. However, this is not limited in the present embodiment. In some examples, the transistors in the first light-emitting drive circuit may all be N-type transistors.

As shown in FIG. 4, there are multiple scanning cycles in an image frame, and each scanning cycle may be divided into three stages: a first stage t11, a second stage t12 and a third stage t13.

In the first stage (i.e., reset stage) t11, input of the reset control signal terminal RS is at low level, the seventh transistor T7 is turned on, and the reset voltage provided by the reset voltage terminal VINT is transmitted to the gate electrode of the drive transistor Td through the seventh transistor T7, thereby resetting the gate electrode of the drive transistor Td. An electric potential of node N1 is a reset electric potential provided by the reset voltage terminal VINT.

In the second stage (i.e., data writing stage) t12, input of the first scanning signal terminal G_A is at low level, and the fifth transistor T5 and the sixth transistor T6 are turned on under the control of the first scanning signal terminal G_A. A first data voltage Vdata_A provided by the first data signal terminal D_A is transmitted to the first electrode of the drive transistor Td through the fifth transistor T5. After the sixth transistor T6 is turned on, the gate electrode and the second electrode of the drive transistor Td are electrically connected, so that the drive transistor Td becomes a diode. At this time, the first data voltage Vdata_A charges the gate electrode of the drive transistor Td until the drive transistor Td is turned off. When the drive transistor Td is turned off, a gate source voltage of the drive transistor TD Vgs=Vth, that is, Vg−Vs=Vth. At this time, the gate voltage of the drive transistor Td Vg=Vs+Vth=Vdata_A+Vth. The first data voltage Vdata_A is written to the gate electrode of the drive transistor Td. Under the control of the second scanning signal terminal G_B, the third transistor T3 is turned on, and a second data voltage Vdata_B provided by the second data signal terminal D_B is transmitted to the gate electrode of the fourth transistor T4 through the third transistor T3. At this time, the fourth transistor T4 is turned on, and a voltage of the node N2 is Vdata_B. Under the action of the first capacitor C1 and the second capacitor C2, the electric potentials of node N1 and node N2 remain unchanged until the first scanning signal terminal G_A and the second scanning signal terminal G_B output low levels again.

In the third stage (i.e., light-emitting stage) T13, input of the light-emitting control terminal EM is at low level, and the first transistor T1 and the second transistor T2 are turned on. The second data voltage output by the second data signal terminal D_B is in two modes: high level and low level. It may be set that when the gate electrode of the fourth transistor T4 receives the high level, the fourth transistor T4 is turned off, and when the gate electrode of the fourth transistor T4 receives the low level, the fourth transistor T4 is turned on. The second data voltage is at a low level, and the fourth transistor T4 is turned on. A current path between the first operation voltage terminal VL1 and the second operation voltage terminal VL2 is conducted. A driving current I generated by the drive transistor Td operating in the saturation region is transmitted to the micro light-emitting element EL through the current path, and the micro light-emitting element EL emits light.

The above driving current $I = K(Vgs - Vth)2$ $$= K(Vg - Vs - Vth)2$$

$$= K(Vdata\_A + Vth - VDD - Vth)2$$

$$= K(Vdata\_A - VDD)2.$$

Where K is a fixed constant related to process parameters and geometric dimensions of the drive transistor.

It can be seen that the driving current I has nothing to do with a threshold voltage of the drive transistor Td, and magnitude of the driving current I will not change due to shift of the threshold voltage Vth of the drive transistor Td. The impact of threshold voltage of driving transistor on the micro light-emitting element EL can be eliminated and thereby improves the display uniformity and light-emitting efficiency.

Figure 5:
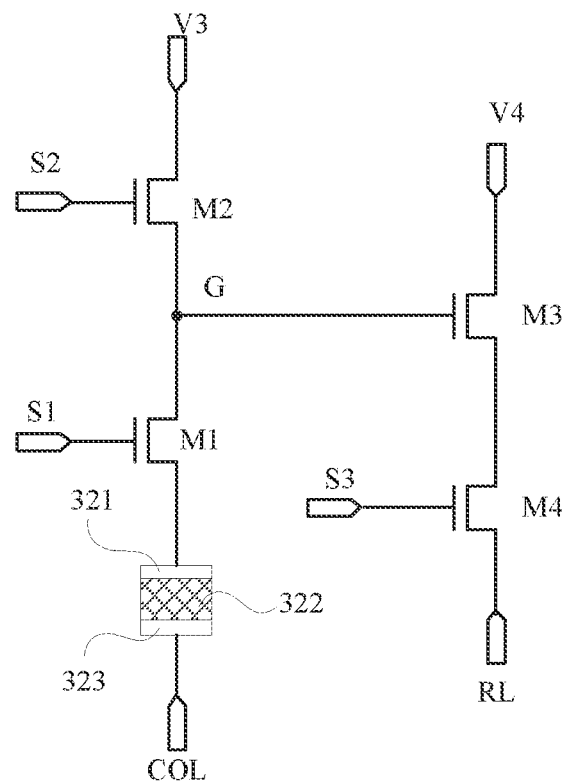
FIG. 5 is an equivalent circuit diagram of an ultrasonic detection circuit according to at least one embodiment of the present disclosure.
Figure 6:
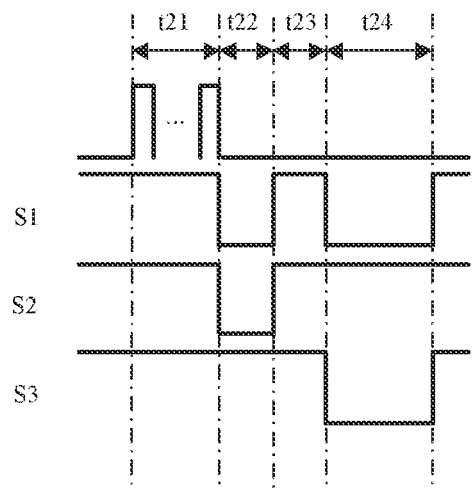
FIG. 6 is an operating timing diagram of the ultrasonic detection circuit provided in FIG. 5.

FIG. 5 is an equivalent circuit diagram of an ultrasonic detection circuit according to at least one embodiment of the present disclosure. FIG. 6 is an operating timing diagram of the ultrasonic detection circuit provided in FIG. 5. As shown in FIG. 5, the ultrasonic detection circuit according to this exemplary embodiment may include a first switch transistor M1, a reset transistor M2, a follower transistor M3 and a second switch transistor M4. A gate electrode of the first switch transistor M1 is connected to a first output control terminal S1, a first electrode of the first switch transistor M1 is connected to a receive electrode 321 of an ultrasonic sensor element, and a second electrode of the first switch transistor M1 is connected to a node G. A gate electrode of reset transistor M2 is connected to a second output control terminal S2, a first electrode of reset transistor M2 is connected to an initial voltage terminal V3, and a second electrode of reset transistor M2 is connected to the node G. A gate electrode of the follower transistor M3 is connected to the node G, a first electrode of the follower transistor M3 is connected to a third operation voltage terminal V4, and a second electrode of the follower transistor M3 is connected to the first electrode of the second switch transistor M4. A gate electrode of the second switch transistor M4 is connected to the third output control terminal S3, and a second electrode of the second switch transistor M4 is connected to a read signal terminal RL. A transmit electrode 323 of the ultrasonic sensing element is connected to an ultrasonic control terminal COL.

With reference to FIG. 6, description is made with the first switch transistor M1, the reset transistor M2, the follower transistor M3 and the second switch transistor M4 all being P-type transistors. However, this is not limited in the present embodiment. In some examples, the transistors in the ultrasonic detection circuit may all be N-type transistors.

As shown in FIG. 6, a working process of the ultrasonic detection circuit includes: an ultrasonic emission stage t21, a reset stage t22, a charge accumulation stage t23 and a sampling stage t24.

In an ultrasonic transmitting stage t21, the ultrasonic control terminal COL applies an alternating driving voltage to the transmit electrode 321, so that the piezoelectric functional layer 322 generates ultrasonic waves. Inputs of the first output control terminal S1, the second output control terminal S2 and the third output control terminal S3 may all be at high level, and the first switch transistor M1, the reset transistor M2 and the second switch transistor M4 are all turned off.

In the reset stage t22, the ultrasonic control terminal COL no longer applies the alternating driving voltage to the transmit electrode 321. Inputs of the first output control terminal S1 and the second output control terminal S2 are at low level, and the first switch transistor M1 and the reset transistor M2 are turned on. The initialization signal provided by the initial voltage terminal V3 is output to the node G through the reset transistor M2 to reset the node G, and an initialization signal is output to the receive electrode 321 of the ultrasonic sensor element through the first switch transistor M1 to reset the receive electrode 321.

In the charge accumulation stage t23, the control signal terminal COL may supply a constant voltage to the transmit electrode 323. Inputs of the first output control terminal S1, the second output control terminal S2 and the third output control terminal S3 may all be at high level, and the first switch transistor M1, the reset transistor M2 and the second switch transistor M4 are all turned off. At this stage, the ultrasonic signal reaches the fingerprint of the finger and reaches the piezoelectric functional layer 322 after reflection. The piezoelectric functional layer 322 will produce positive piezoelectric effect, which produces multiple local charge accumulations on the surface of the piezoelectric functional layer 322.

In the sampling phase t24, input of the first output control terminal S1 is at low level, and the first switch transistor M1 is turned on. The second output control terminal S2 inputs a high level, and the reset transistor M2 is turned off. Input of the third output control terminal S3 is at low level, and the second switch transistor M4 is turned on. The first switch transistor M1 transmits the fingerprint electrical signal collected by the receive electrode 321 to the gate electrode of the follower transistor M3, so that the follower transistor M3 generates a corresponding current signal and outputs the current signal to the reading signal terminal RL through the second switch transistor M4. The reading signal terminal RL transmits a voltage signal corresponding to the current signal output by the follower transistor M3 to a processing circuit in the circuit board to obtain an image reflecting fingerprint information.

The above-mentioned first light-emitting drive circuit and ultrasonic detection circuit are only examples, which is not limited in the present embodiment.

The following is an exemplary explanation through a preparation process of the display substrate. The "patterning process" mentioned in the present disclosure includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, the evaporation and chemical vapor deposition, coating may be implemented by any one or more of spraying coating, spin coating and ink-jet printing, and the etching may be implemented by any one or more of dry etching and wet etching, and these are not limited in the present disclosure. A "thin film" refers to a layer of thin film manufactured by a certain material on a base substrate by using deposition, coating or another process. If the "thin film" does not need a patterning process during the whole manufacturing process, the "thin film" can also be called a "layer". If the "thin film" needs a patterning process in the whole manufacturing process, it is referred to as a "thin film" before the patterning process and as a "layer" after the patterning process. The "layer" after the patterning process contains at least one "pattern".

In the present disclosure, "A and B are arranged on the same layer" indicates that A and B are simultaneously formed by the same patterning process, and a "thickness" of the film layer is the dimension of the film layer in a direction perpendicular to the display substrate. In an exemplary embodiment of the present disclosure, "an orthographic projection of A includes an orthographic projection of B" means that a boundary of the orthographic projection of B falls within a boundary range of the orthographic projection of A, or a boundary of the orthographic projection of A overlaps with a boundary of the orthographic projection of B.

Figure 7A:
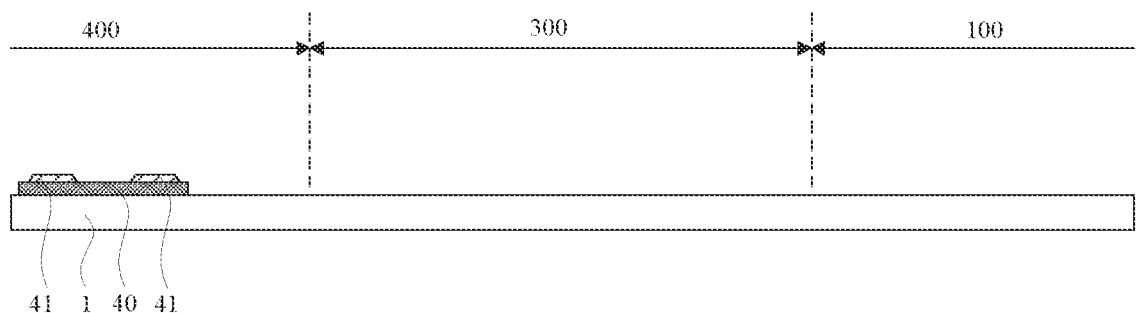
FIG. 7A is a schematic diagram of a display substrate after a pattern of a bonding electrode is formed according to at least one embodiment of the present disclosure.
Figure 7B:
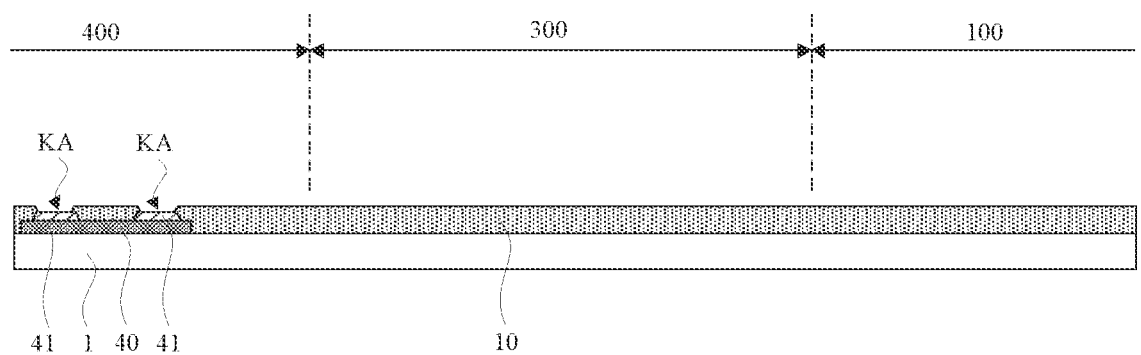
FIG. 7B is a schematic diagram of a display substrate after a base substrate pattern is formed according to at least one embodiment of the present disclosure.
Figure 7C:
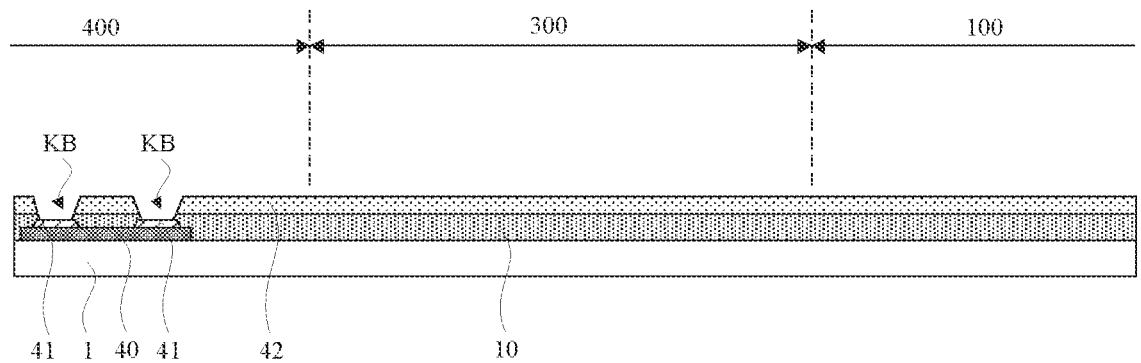
FIG. 7C is a schematic diagram of a display substrate after a pattern of a passivation layer is formed according to at least one embodiment of the present disclosure.
Figure 7D:
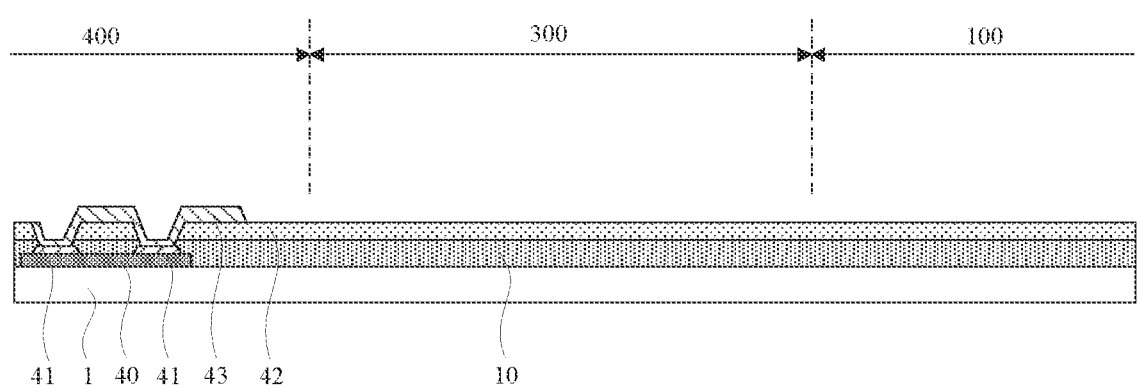
FIG. 7D is a schematic diagram of a display substrate after a pattern of a fan-out lead layer is formed according to at least one embodiment of the present disclosure.
Figure 7E:
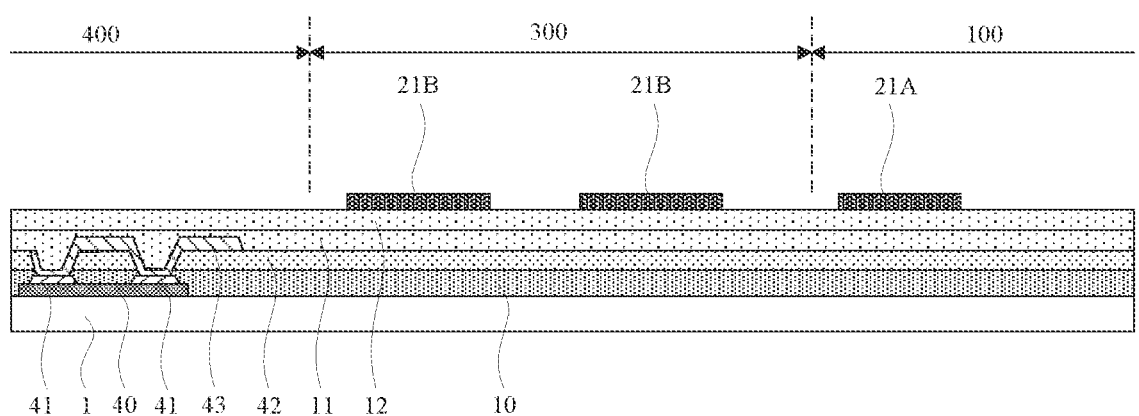
FIG. 7E is a schematic diagram of a display substrate after a pattern of an active layer is formed according to at least one embodiment of the present disclosure.
Figure 7F:
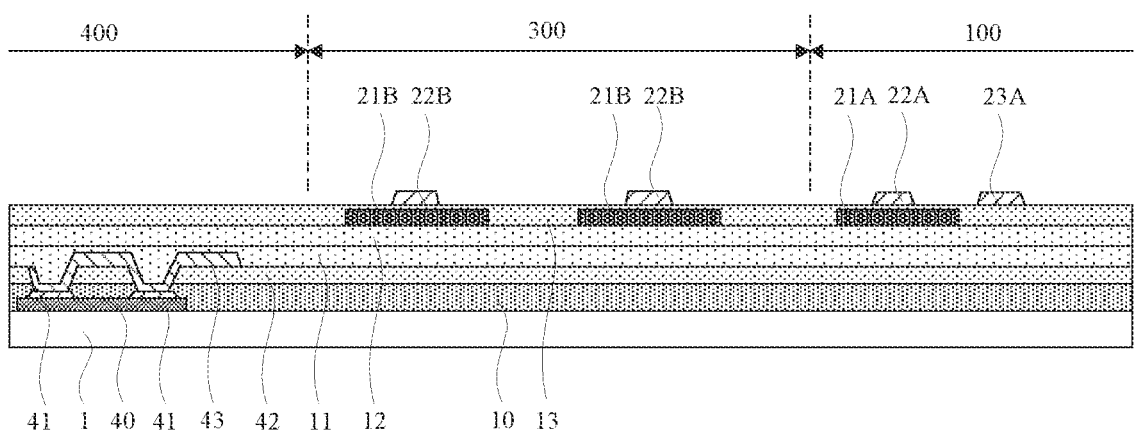
FIG. 7F is a schematic diagram of a display substrate after a pattern of a first gate metal layer is formed according to at least one embodiment of the present disclosure.
Figure 7G:
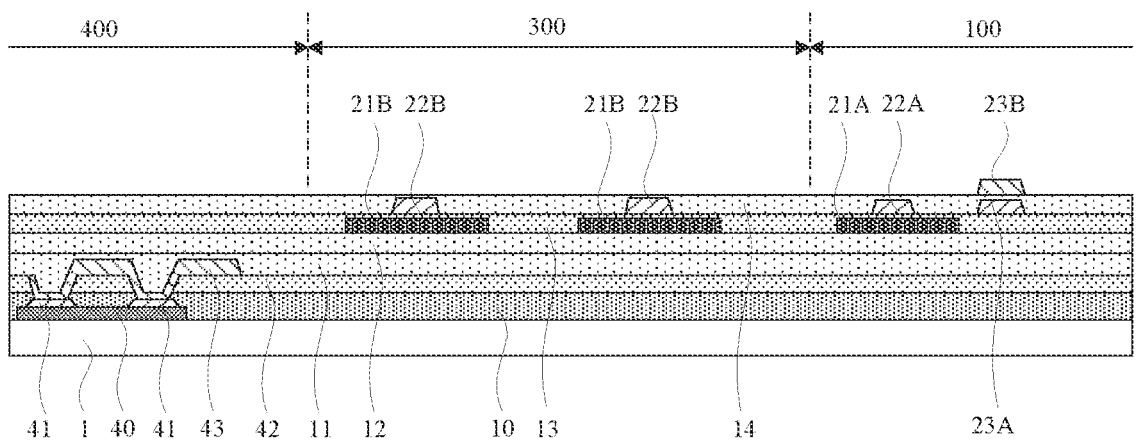
FIG. 7G is a schematic diagram of a display substrate after a pattern of a second gate metal layer is formed according to at least one embodiment of the present disclosure.
Figure 7H:
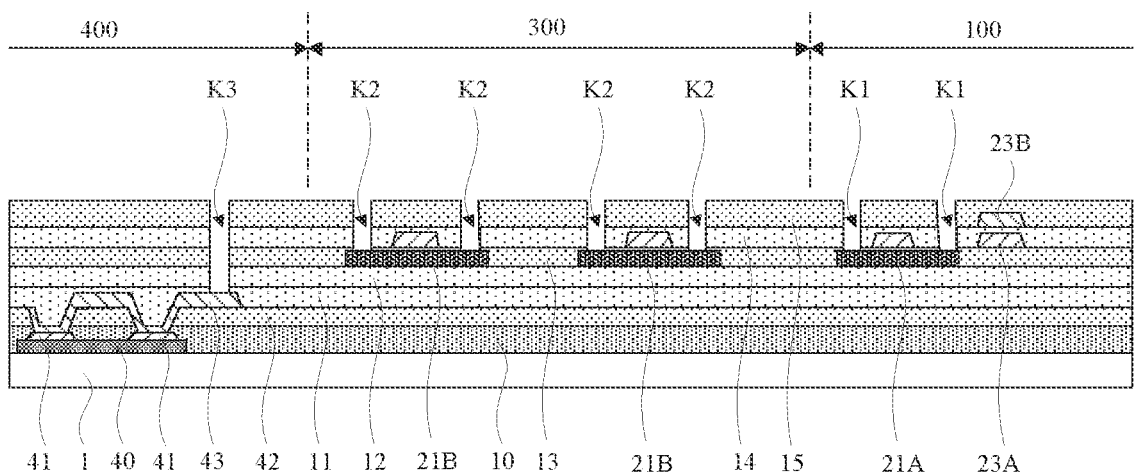
FIG. 7H is a schematic diagram of a display substrate after a pattern of a fifth insulating layer is formed according to at least one embodiment of the present disclosure.
Figure 7I:
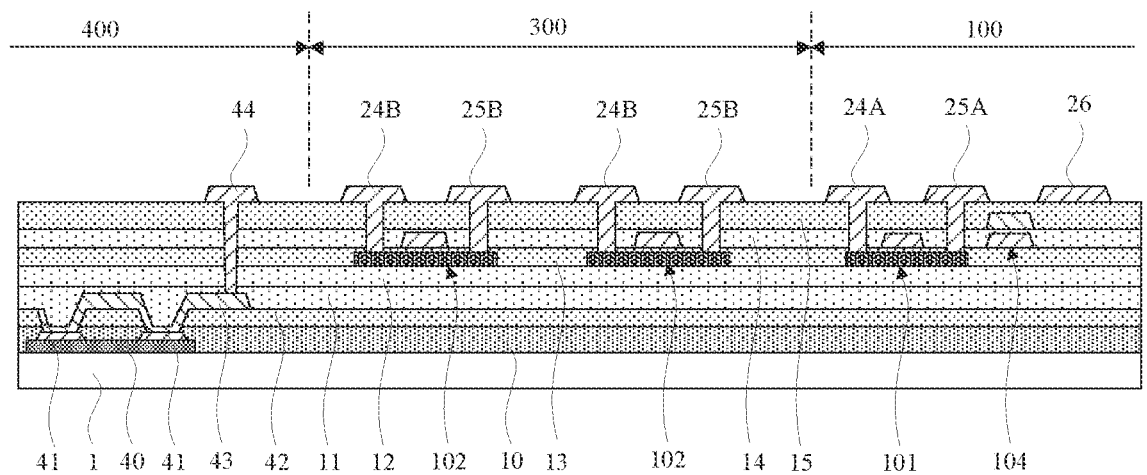
FIG. 7I is a schematic diagram of a display substrate after a pattern of a source and drain metal layer is formed according to at least one embodiment of the present disclosure.
Figure 7J:
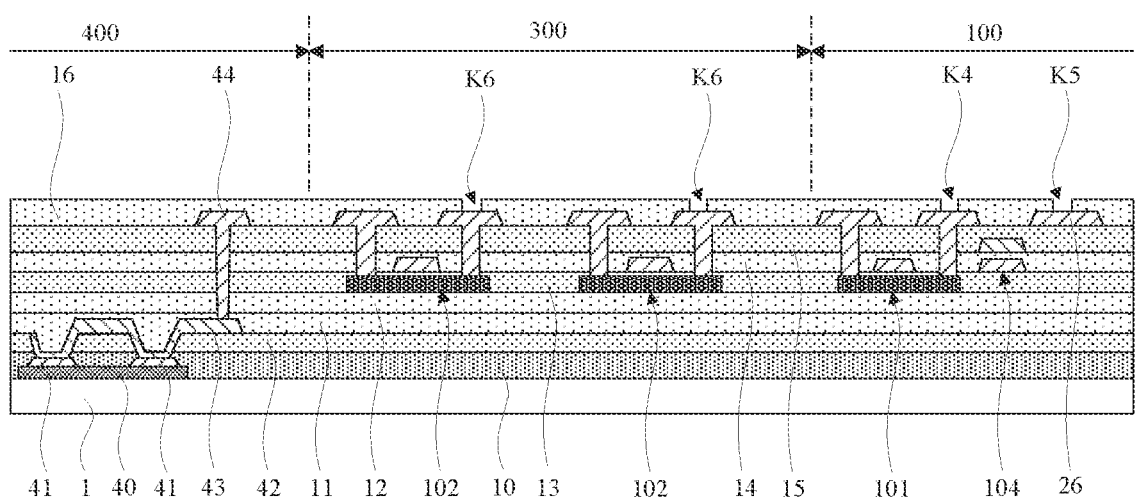
FIG. 7J is a schematic diagram of a display substrate after a pattern of a sixth insulating layer is formed according to at least one embodiment of the present disclosure.
Figure 7K:
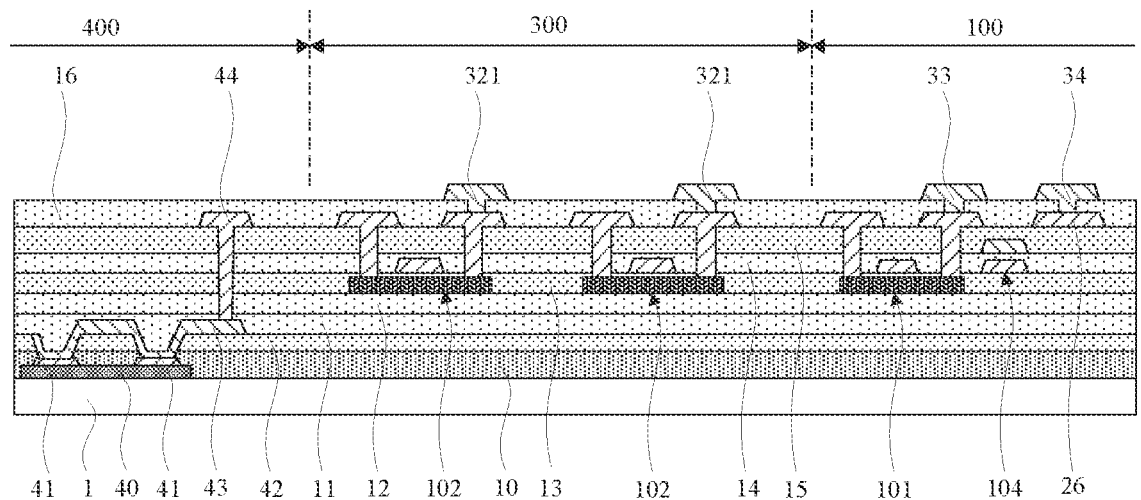
FIG. 7K is a schematic diagram of a display substrate after patterns of a receive electrode, a first connection electrode and a second connection electrode are formed according to at least one embodiment of the present disclosure.
Figure 7L:
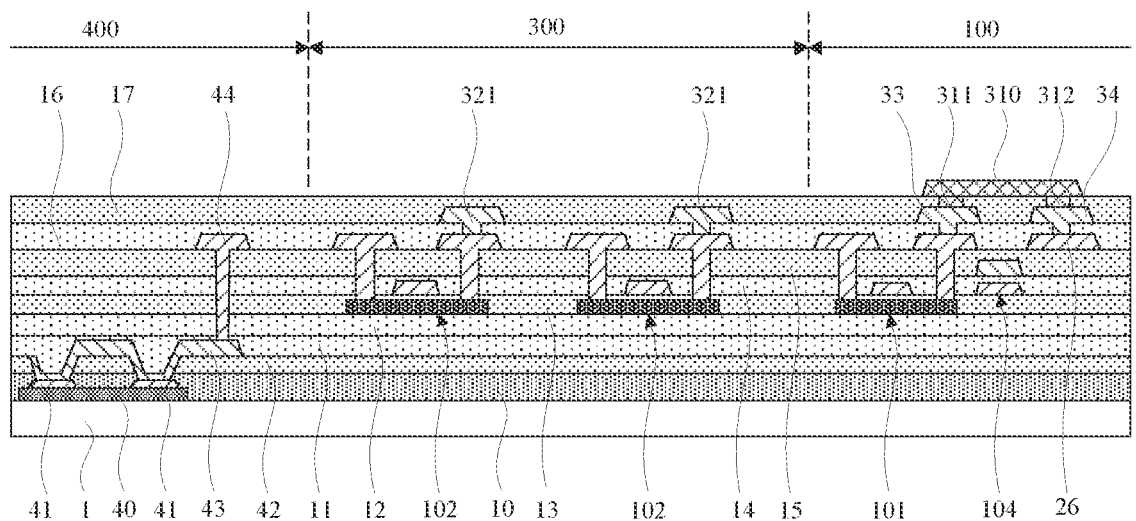
FIG. 7L is a schematic diagram of a display substrate after micro light-emitting elements are formed according to at least one embodiment of the present disclosure.
Figure 7M:
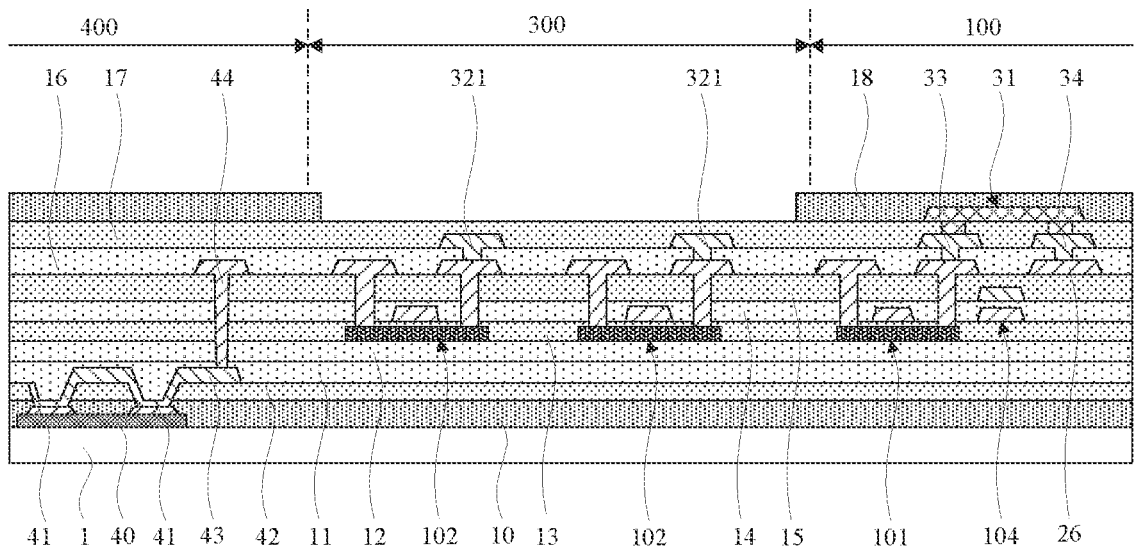
FIG. 7M is a schematic diagram of a display substrate after a pattern of a transparent organic insulating layer is formed according to at least one embodiment of the present disclosure.
Figure 7N:
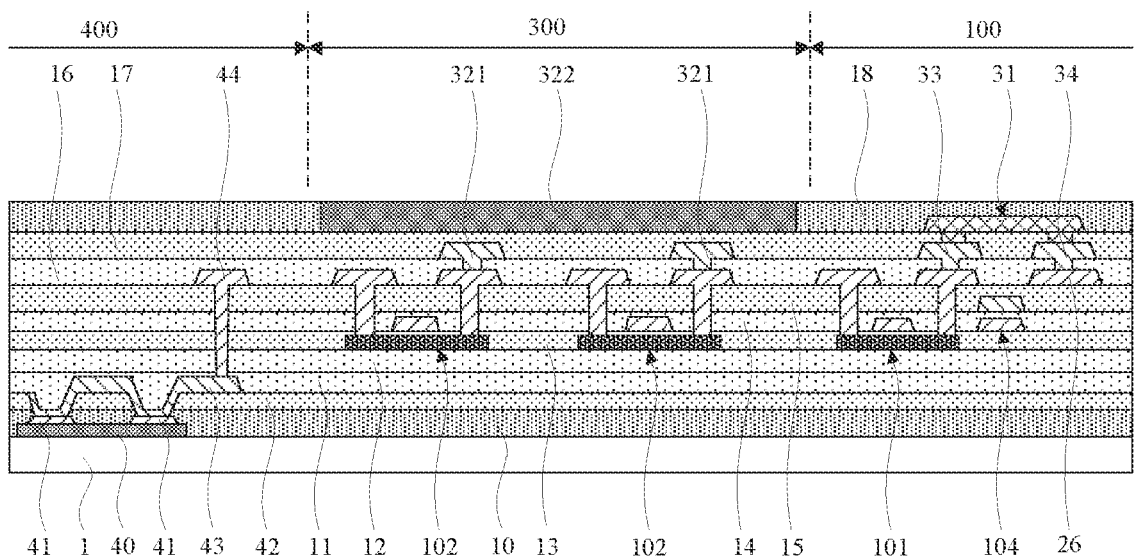
FIG. 7N is a schematic diagram of a display substrate after a pattern of a piezoelectric functional layer is formed according to at least one embodiment of the present disclosure.
Figure 7O:
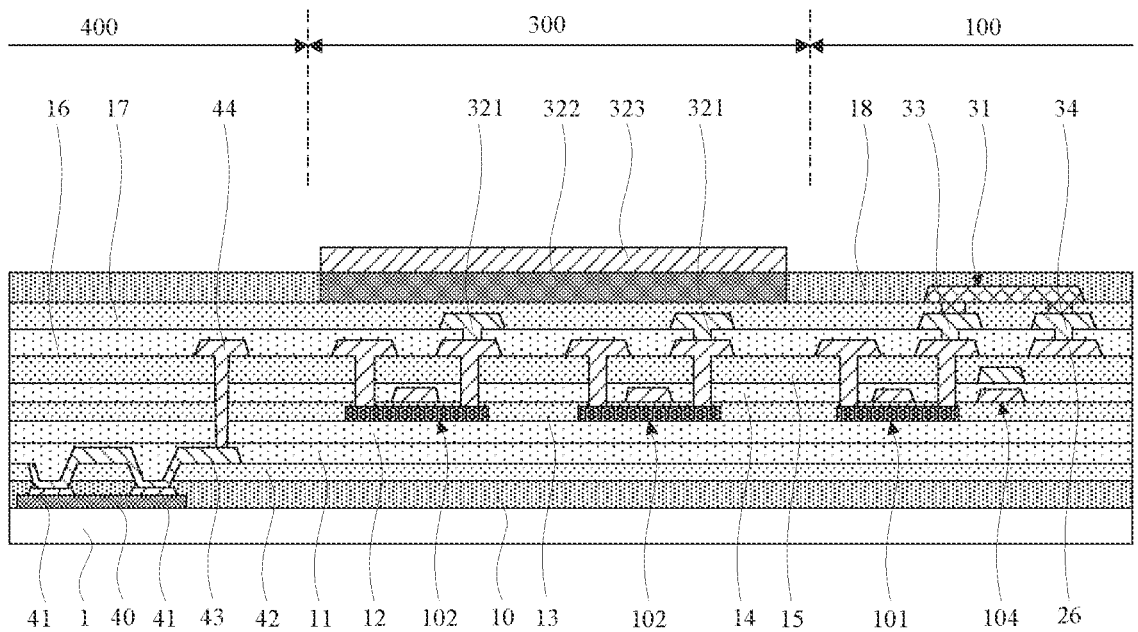
FIG. 7O is a schematic diagram of a display substrate after a pattern of an transmit electrode layer is formed according to at least one embodiment of the present disclosure.
Figure 7P:
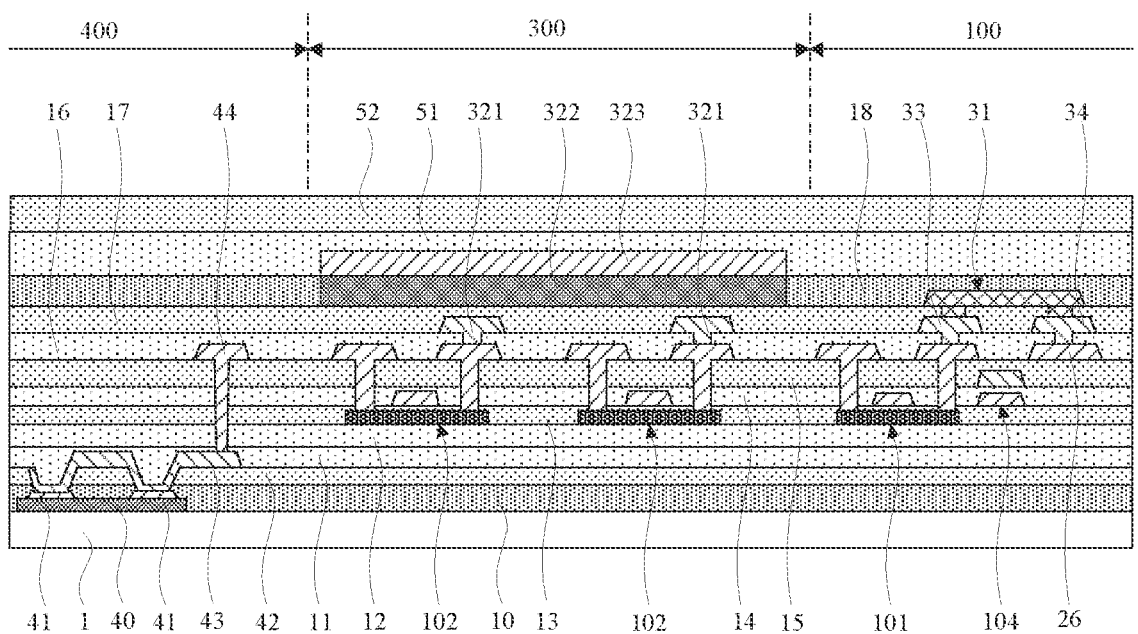
FIG. 7P is a schematic diagram of a display substrate after a cover plate is formed according to at least one embodiment of the present disclosure.

In some exemplary embodiments, a preparation process of the display substrate may include the following operations, as shown in FIGS. 7A to 7P.

(1) Forming a De-Bonding Layer (DBL) and a Pattern of a Bonding Electrode on a Glass Carrier Plate.

In some exemplary embodiments, a de-bonding material is coated on the glass carrier plate 1, and a pattern of a de-bonding layer 40 is formed through a patterning process; then, a bonding metal film is deposited on the de-bonding layer 40, and patterns of multiple bonding electrodes 41 are formed through a patterning process. As shown in FIG. 7A, a de-bonding layer 40 and multiple bonding electrodes 41 are formed in a bonding region 400, and the multiple bonding electrodes 41 are located on the de-bonding layer 40. In some examples, the de-bonding material may be an organic material.

(2) Preparing a Flexible Base Substrate on a Glass Carrier.

In some exemplary embodiments, an organic material (e.g., polyimide (PI), polyethylene terephthalate (PET) or a surface-treated polymer soft film, etc.) is coated on the glass carrier plate 1 with the aforementioned structure formed, and a base substrate 10 is formed through a patterning process. As shown in FIG. 7B, multiple first bonding via holes KA are provided on the base substrate 10 in the bonding region 400, and the base substrate 10 in any one of the first bonding via holes KA is etched off to expose a surface of a bonding electrode 41.

After this process, both the display region 100 and the ultrasonic sensing region 300 include the flexible base substrate 10.

(3) Preparing a Passivation Layer (PVX) on the Base Substrate.

In some exemplary embodiments, a layer of passivation thin film is deposited on the base substrate 10 with the aforementioned structure formed, and the passivation thin film is patterned through a patterning process to form the passivation layer 42. As shown in FIG. 7C, the passivation layer 42 of the bonding region 400 is provided with multiple second bonding via holes KB, wherein positions of the multiple second bonding via holes KB correspond to positions of the multiple first bonding via holes KA one by one and a second bonding via hole KB communicate with a corresponding first bonding via hole KA to exposing a surface of a bonding electrode 41.

After this process, the display region 100 and the ultrasonic sensing region 300 include a base substrate 10 and a passivation layer 42 stacked on the base substrate 10.

(4) Preparing a Pattern of a Fan-Out Lead Layer on the Base Substrate.

In some exemplary embodiments, a layer of fan-out metal thin film is deposited on the base substrate 10 with the aforementioned structure formed, and the fan-out metal thin film is patterned through a patterning process to form a pattern of a fan-out lead layer. As shown in FIG. 7D, a fan-out lead layer is formed in the bonding region 400, wherein the fan-out lead layer includes multiple fan-out leads (only one fan-out lead 43 is illustrated in FIG. 7D). The fan-out lead 43 is electrically connected to at least one bonding electrode 41 through the second bonding via hole KB and the first bonding via hole KA. In this exemplary embodiment, the fan-out lead 43 is connected to the two bonding electrodes 41 to ensure quality of signal transmission. However, this is not limited in the present embodiment.

After this process, film layer structures of the display region 100 and the ultrasonic sensing region 300 do not change.

(5) Preparing a Pattern of an Active Layer on the Base Substrate.

In some exemplary embodiments, a first insulating thin film, a second insulating thin film and an active layer thin film are sequentially deposited on the base substrate 10 with the aforementioned structure formed, and the active layer thin film is patterned through a patterning process to form a first insulating layer 11 covering the entire base substrate 10, a second insulating layer 12 disposed on the first insulating layer 11 and a pattern of an active layer disposed on the second insulating layer 12. As shown in FIG. 7E, the pattern of the active layer is formed in the display region 100 and the ultrasonic sensing region 300, and includes at least a first active layer 21A and a second active layer 21B. The first active layer 21A is located in the display region 100, and the second active layer 21B is located in the ultrasonic sensing region 300.

After this patterning process, the bonding region 400 includes the de-bonding layer 40, the multiple bonding electrodes 41 disposed on the de-bonding layer 40, the base substrate 10, the passivation layer 42, the fan-out lead layer electrically connected to the bonding electrodes 41, the first insulating layer 11 covering the fan-out lead layer and the second insulating layer 12.

(6) Preparing a Pattern of a First Gate Metal Layer on the Base Substrate.

In some exemplary embodiments, a third insulating thin film and a first metal thin film are sequentially deposited on the base substrate 10 with the aforementioned structure formed, and the first metal thin film is patterned through a patterning process to form a third insulating layer 13 covering the pattern of the active layer and a pattern of a first gate metal layer disposed on the third insulating layer 13. As shown in FIG. 7F, the pattern of the first gate metal layer is formed in the display region 100 and the ultrasonic sensing region 300, and at least includes a first gate electrode 22A, a second gate electrode 22B, a first capacitor electrode 23A, multiple gate lines (not shown) and multiple gate leads (not shown). The first gate electrode 22A and the first capacitor electrode 23A are located in the display region 100, and the second gate electrode 22B is located in the ultrasonic sensing region 300.

After this patterning process, the bonding region 400 includes the de-bonding layer 40, the multiple bonding electrodes 41 disposed on the de-bonding layer 40, the base substrate 10, the first insulating layer 11, the fan-out lead layer electrically connected to the bonding electrodes 41, the first insulating layer 11 covering the fan-out lead layer, the second insulating layer 12 and the third insulating layer 13.

(7) Preparing a Pattern of a Second Gate Metal Layer on the Base Substrate.

In some exemplary embodiments, a fourth insulating thin film and a second metal thin film are sequentially deposited on the base substrate 10 with aforementioned structure formed, and the second metal thin film is patterned through a patterning process to form a fourth insulating layer 14 covering the first gate metal layer and a pattern of the second gate metal layer disposed on the fourth insulating layer 14. As shown in FIG. 7G, the pattern of the second gate metal layer is formed in the display region 100, and at least includes a second capacitor electrode 23B, wherein position of the second capacitor electrode 23B corresponds to that of the first capacitor electrode 23A.

After this patterning process, the bonding region 400 includes the de-bonding layer 40, the multiple bonding electrodes 41 disposed on the de-bonding layer 40, the base substrate 10, the first insulating layer 11, the fan-out lead layer electrically connected to the bonding electrodes 41, the first insulating layer 11 covering the fan-out lead layer, the second insulating layer 12, the third insulating layer 13 and the fourth insulating layer 14.

(8) Preparing a Pattern of a Fifth Insulating Layer on the Base Substrate.

In some exemplary embodiments, a fifth insulating thin film is deposited on the base substrate 10 with the aforementioned structure formed, and the fifth insulating thin film is patterned through a patterning process to form a fifth insulating layer 15 pattern covering the second gate metal layer. As shown in FIG. 7H, the fifth insulating layer 15 is provided with multiple first via holes K1, multiple second via holes K2 and multiple third via holes (only one third via hole K3 is illustrated in FIG. 7H). The multiple first via holes K1 are formed in the display region 100, and positions of two first via holes K1 respectively correspond to positions of two ends of the first active layer 21A. The fifth insulating layer 15, the fourth insulating layer 14 and the third insulating layer 13 in any one of the first via holes K1 are etched off to expose a surface of the first active layer 21A. The multiple second via holes K2 are formed in the ultrasonic sensing region 300, and positions of two second via holes K2 correspond to positions of two ends of the second active layer 21B. The fifth insulating layer 15, the fourth insulating layer 14 and the third insulating layer 13 in any one of the second via holes K2 are etched off to expose a surface of the second active layer 21B. The third via hole K3 is formed in the bonding region 400, and the fifth insulating layer 15, the fourth insulating layer 14, the third insulating layer 13, the second insulating layer 12 and the first insulating layer 11 in the third via hole K3 are etched off to expose a surface of the fan-out lead 43.

(9) Preparing a Pattern of a Source and Drain Metal Layer on the Base Substrate.

In some exemplary embodiments, a third metal thin film is deposited on the base substrate 10 with the aforementioned structure formed, and the third metal thin film is patterned through a patterning process to form a pattern of a source and drain metal layer on a fifth insulating layer 15. As shown in FIG. 7I, the pattern of the source and drain metal layer includes a first source electrode 24A, a first drain electrode 25A and a common electrode line 26 which are formed in the display region 100, a second source electrode 24B and a second drain electrode 25B which are formed in the ultrasonic sensing region 300, and a fan-out connection electrode 44 formed in the bonding region 400. The first source electrode 24A and the first drain electrode 25A are respectively connected to the first active layer 21A through first via holes, and the second source electrode 24B and the second drain electrode 25B are respectively connected to the second active layer 21B through second via holes. The fan-out connection electrode 44 is connected to the fan-out lead 43 through a third via hole.

In some examples, the source and drain metal layer may further include any one or more of a polarization line, a power supply line (VDD), a compensation line, and an auxiliary cathode. However, this is not limited in the present embodiment. In some examples, the polarization line may be configured to provide a charge release path for the display substrate during a subsequent polarization process. The polarization line may be disposed at an edge of the display substrate, and may be cut off during a subsequent cutting process of the display substrate.

At this point, the pattern of the circuit structure layer is prepared on the base substrate 10, as shown in FIG. 7I. In the display region 100, the first active layer 21A, the first gate electrode 22A, the first source electrode 24A and the first drain electrode 25A form a first thin film transistor 101, and the first capacitor electrode 23A and the second capacitor electrode 23B form a first storage capacitor 104. In some examples, the first thin film transistor 101 is, for example, the fourth transistor T4 in the first light-emitting drive circuit shown in FIG. 3, and the first storage capacitor 104 is, for example, the first capacitor C1 in the first light-emitting drive circuit shown in FIG. 3. In the ultrasonic sensing region 300, the second active layer 21B, the second gate electrode 22B, the second source electrode 24B, and the second drain electrode 25B form a second thin film transistor 102, and two second thin film transistors 102 are illustrated as an example in FIG. 7I. In some examples, the second thin film transistor 102 is, for example, the first switch transistor M1 in the ultrasonic detection circuit shown in FIG. 5. However, this is not limited in the present embodiment.

(10) Preparing a Sixth Insulating Layer on the Base Substrate.

In some exemplary embodiments, a sixth insulating thin film is deposited on the base substrate 10 with the aforementioned structure formed, and the sixth insulating thin film is patterned through a patterning process to form a pattern of a sixth insulating layer 16 covering the source and drain metal layer. As shown in FIG. 7J, the sixth insulating layer 16 is provided with multiple fourth via holes, multiple fifth via holes (only one fourth via hole K4 and one fifth via hole K5 are illustrated in FIG. 7J) and multiple sixth via holes K6. The fourth via hole K4 and the fifth via hole K5 are formed in the display region 100. The sixth insulating layer 16 in the fourth via hole K4 is etched off to expose a surface of the first drain electrode of the first thin film transistor 101. The sixth insulating layer 16 in the fifth via hole K5 is etched off to expose a surface of the common electrode line 26. The sixth via holes K6 are formed in the ultrasonic sensing region 300, and the sixth insulating layer 16 in the sixth via holes K6 is etched off to expose surfaces of the second drain electrodes of the second thin film transistors 102.

After this patterning process, the bonding region 400 includes the de-bonding layer 40, the multiple bonding electrodes 41 disposed on the de-bonding layer 40, the base substrate 10, the first insulating layer 11, the fan-out lead layer electrically connected to the bonding electrodes 41, the first insulating layer 11 covering the fan-out lead layer, the second insulating layer 12, the third insulating layer 13, the fourth insulating layer 14, the fifth insulating later 15 and the sixth insulating layer 16.

(11) Preparing Patterns of Multiple Receive Electrodes, Multiple First Connection Electrodes and Multiple Second Connection Electrodes on the Base Substrate.

In some exemplary embodiments, a fourth metal thin film is deposited on the base substrate 10 with the aforementioned structure formed, and the fourth metal thin film is patterned through a patterning process to form patterns of multiple receive electrodes, multiple first connection electrodes and multiple second connection electrodes (only two receive electrodes 321, one first connection electrode 33 and one second connection electrode 34 are illustrated in FIG. 7K). As shown in FIG. 7K, the receive electrodes 321 are formed in the ultrasonic sensing region 300, and are connected to the second drain electrodes of the second thin film transistors 102 through the sixth via holes K6. The first connection electrode 33 and the second connection electrode 34 are formed in the display region 100. The first connection electrode 33 is connected to the first drain electrode of the first thin film transistor 101 through the fourth via hole K4, and the second connection electrode 34 is connected to the common electrode line 26 through the fifth via hole K5.

After this patterning process, the film layer structures of the bonding region 400 do not change.

(12) Preparing a Seventh Insulating Layer on the Base Substrate, and Transferring the Micro Light-Emitting Element.

In some exemplary embodiments, a seventh insulating thin film is deposited on the base substrate 10 with the aforementioned structure formed, and the seventh insulating thin film is patterned through a patterning process to form a pattern of a seventh insulating layer 17. As shown in FIG. 7L, the seventh insulating layer 17 forms multiple first grooves and multiple second grooves in the display region 100 (only one first groove and one second groove are illustrated in FIG. 7L). The seventh insulating layer 17 in the first groove is etched off to expose a surface of the first connection electrode 33. The seventh insulating layer 17 in the second groove is etched off to expose a surface of the second connection electrode 34.

In some exemplary embodiments, the micro light-emitting element is a Micro-LED. The micro light-emitting element 31 includes a first electrode 311, a second electrode 312 and a light-emitting part 310. The first electrode 311 is connected to a first end of the light-emitting part 310, and the second electrode 312 is connected to a second end of the light-emitting part 310. In some examples, the first electrode 311 may be an anode and the second electrode 312 may be a cathode. However, this is not limited in the present embodiment. In some examples, a bonding material (e.g., solder paste) is added into the first groove and the second groove respectively by a dispensing machine in a vacuum environment, and the bonding of the micro light-emitting element is completed by a transfer process. The first electrode 311 of the micro light-emitting element is bonded and connected to the first connection electrode 33 by the bonding material in the first groove, and the second electrode 312 is bonded and connected to the second connection electrode 34 by the bonding material in the second groove. In this way, the first electrode 311 of the micro light-emitting element is connected to the first drain electrode of the first thin film transistor 101 through the first connection electrode 33, and the second electrode 312 is connected to the common electrode line 26 through the second connection electrode 34.

After this process, the bonding region 400 includes the de-bonding layer 40, the multiple bonding electrodes 41 disposed on the de-bonding layer 40, the base substrate 10, the first insulating layer 11, the fan-out lead layer electrically connected to the bonding electrodes 41, the first insulating layer 11 covering the fan-out lead layer, the second insulating layer 12, the third insulating layer 13, the fourth insulating layer 14, the fifth insulating later 15, the sixth insulating layer 16 and the seventh insulating layer 17.

(13) Preparing a Transparent Organic Insulating Layer on the Base Substrate.

In some exemplary embodiments, a transparent organic insulating thin film is coated on the base substrate 10 with the aforementioned structure formed, and the transparent organic insulating thin film is patterned through a patterning process to form a pattern of a transparent organic insulating layer 18. As shown in FIG. 7M, the transparent organic insulating layer 18 may cover the display region 100 and the bonding region 400, and the transparent organic insulating layer 18 is not provided in the ultrasonic sensing region 300. In some examples, the transparent organic insulating layer 18 may be disposed in a region other than the ultrasonic sensing region 300. In some examples, the transparent organic insulating layer 18 may be made of polyimide (PI), acrylic or polyethylene terephthalate.

After this process, the bonding region 400 includes the de-bonding layer 40, the multiple bonding electrodes 41 disposed on the de-bonding layer 40, the base substrate 10, the first insulating layer 11, the fan-out lead layer electrically connected to the bonding electrodes 41, the first insulating layer 11 covering the fan-out lead layer, the second insulating layer 12, the third insulating layer 13, the fourth insulating layer 14, the fifth insulating later 15, the sixth insulating layer 16, the seventh insulating layer 17 and the transparent organic insulating layer 18.

In this exemplary embodiment, the transparent organic insulating layer covers the multiple micro light-emitting elements, so that the micro light-emitting elements can be encapsulated and protected without reducing the light transmittance (for example, the light transmittance can be greater than 90%) of light emitted from the micro light-emitting elements, thereby ensuring the display effect.

(14) Preparing a Piezoelectric Functional Layer on the Base Substrate.

In some exemplary embodiments, a piezoelectric material is coated on the base substrate 10 with the aforementioned structure formed to form a pattern of a piezoelectric functional layer 322. As shown in FIG. 7N, the piezoelectric functional layer 322 is formed in the ultrasonic sensing region 300. A thickness of the piezoelectric functional layer 322 may be approximately equal to a thickness of the transparent organic insulating layer 18. In some examples, an absolute value of difference between the thickness of the transparent organic insulating layer 18 and the thickness of the piezoelectric functional layer 322 may be less than 1 micrometer (μm).

In some examples, the piezoelectric material may be polyvinylidene fluoride (PVDF), piezoelectric ceramic, electret, etc. However, this is not limited in the present embodiment.

In some exemplary embodiments, the piezoelectric functional layer 322 is polarized using the transparent organic insulating layer 18 as a mask (for example, a strong direct current electric field is applied to the piezoelectric functional layer). During the polarization process, the charges generated in the polarization process may be led out from the display substrate using polarization lines, so as to avoid the impact on the circuit structure of the display substrate. In this exemplary embodiment, the ultrasonic sensing region 300 is covered by the piezoelectric functional layer 322, and the rest regions of the display substrate are covered by the transparent organic insulating layer 18. Therefore, during the polarization process, the piezoelectric functional layer 322 and the transparent organic insulating layer 18 can effectively protect the thin film transistors in the circuit structure layer from being damaged or penetrated by a polarized electric field.

(15) Preparing a Pattern of a Transmit Electrode Layer on the Base Substrate.

In some exemplary embodiments, a fifth metal thin film is deposited on the base substrate 10 with the aforementioned structure formed, and a pattern of a transmit electrode layer is formed through a patterning process. As shown in FIG. 7O, the transmit electrode layer is formed in the ultrasonic sensing region 300, and includes a sheet transmit electrode 323, and the transmit electrode 323 is in direct contact with the piezoelectric functional layer 322.

(16) Preparing a Cover Plate on the Base Substrate.

In some exemplary embodiments, an adhesive layer 51 is formed by optical clear adhesive (OCA) on the base substrate 10 with the aforementioned structure formed, and a cover plate 52 (for example, a glass cover plate) is attached to the adhesive layer 51. As shown in FIG. 7P, the cover plate 52 may cover the display region 100, the ultrasonic sensing region 300 and the bonding region 400.

After the above film layer structures are prepared, the display substrate may be peeled off from the glass carrier 1 by a peeling process. Then, the de-bonding layer 40 has the property of peelable metal and the de-bonding layer 40 may be peeled off, so that the bonding electrodes 41 of the display substrate may be bound and connected to the circuit board from the back surface of the display substrate (that is, a surface of the display substrate away from the circuit structure layer). In this exemplary embodiment, the circuit board is disposed on the back surface of the display substrate, that is, the circuit board is placed outside the conduction path of ultrasonic waves, and the ultrasonic wave does not pass the circuit board during the conduction, which can avoid the impact of the circuit board on the conduction of the ultrasonic waves.

In some exemplary embodiments, the passivation thin film, the first insulating thin film, the second insulating thin film, the third insulating thin film, the fourth insulating thin film, the fifth insulating thin film, the sixth insulating thin film, and the seventh insulating thin film may be made of any one or more of silicon oxide (SiOx), silicon nitride (SiNx) and silicon oxynitride (SiON), and may be a single layer, multiple layers or a composite layer. The first insulating layer 11 is called a barrier layer, which is used to improve the water and oxygen resistance of the base substrate. The second insulating layer 12 is called a buffer layer, which is used to improve the water and oxygen resistance of the base substrate. The third insulating layer 13 and the fourth insulating layer 14 are called gate insulator (GI) layers, and the fifth insulating layer 15 is called an interlayer dielectric (ILD) layer, and the sixth insulating layer 16 and the seventh insulating layer 17 are called passivation (PVX) layers. The bonding metal thin film, the fan-out metal thin film, the first metal thin film, the second metal thin film, the third metal thin film, the fourth metal thin film and the fifth metal thin film may be made of metal materials, such as any one or more of silver (Ag), copper (Cu), aluminum (Al) and molybdenum (Mo), or an alloy material of the above metals, such as AlNd alloy or MoNb alloy, which may have a single-layer structure or a multi-layer composite structure, such as Mo/Cu/Mo. The active layer thin film may be made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organic technology.

In this exemplary embodiment, the first light-emitting drive circuits and the ultrasonic detection circuits may be integrated in the circuit structure layer, and an orthographic projection of the ultrasonic sensing elements on the base substrate does not overlap with an orthographic projection of and the micro light-emitting elements on the base substrate, which can reduce the thickness of the display substrate. In addition, the ultrasonic sensing elements and the micro light-emitting elements are disposed side by side, so that the ultrasonic signal does not need to pass through the circuit structure, which reduces loss of the ultrasonic signal, thereby improving the signal-to-noise ratio and the ultrasonic detection effect. Furthermore, the ultrasonic detection circuits and the first light-emitting drive circuits are protected by the piezoelectric functional layer and the transparent organic insulating layer respectively, so that during the polarization process of the piezoelectric functional layer of the ultrasonic sensing element, the transistor of the circuit structure layer can be prevented from damage or penetration by the polarized electric field.

The structure and preparation process of the of display substrate shown in an exemplary embodiment are merely illustrative. In some exemplary embodiment, according to actual needs, corresponding structures may be changed and patterning processes may be added or reduced. For example, the first connection electrode and the second connection electrode may be omitted. The first electrode of the micro light-emitting element may be directly connected to the first drain electrode of the first thin film transistor, and the second electrode of the micro light-emitting element may be directly connected to the common electrode line. For another example, the driving transistor may have a top gate structure, a bottom gate structure, or a single gate structure, or a dual gate structure. However, this is not limited in the present embodiment.

The structure (or method) shown in the present embodiment may be appropriately combined with the structure (or method) shown in another embodiment.

Figure 8:
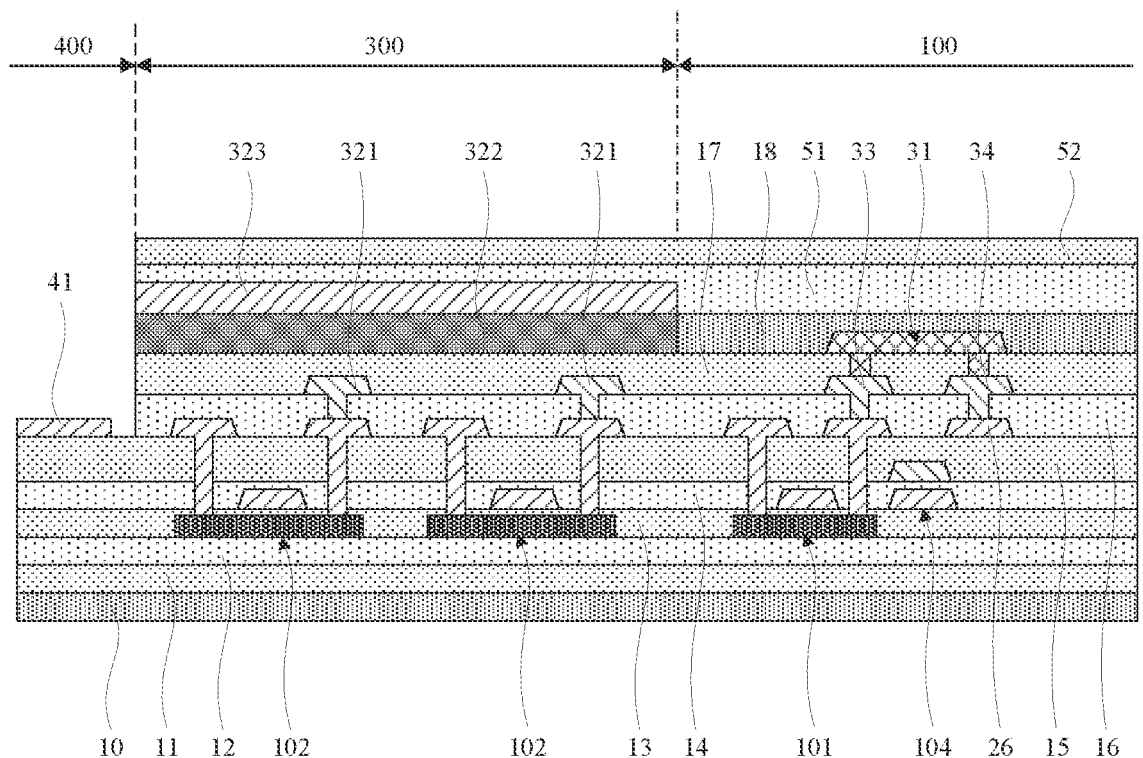
FIG. 8 is another schematic sectional view along the P-P direction in FIG. 1.

FIG. 8 is another schematic sectional view along the P-P direction in FIG. 1. As shown in FIG. 8, in a plane perpendicular to a display substrate, a display region 100 of the display substrate includes: a base substrate 10, a first insulating layer 11, a second insulating layer 12 and a circuit structure layer which are sequentially disposed on the base substrate 10, multiple micro light-emitting elements (only one micro light-emitting element 31 is illustrated in FIG. 8) disposed on the circuit structure layer, a transparent organic insulating layer 18 covering the multiple micro light-emitting elements, an adhesive layer 51 covering the transparent organic insulating layer 18, and a cover plate 52. The circuit structure layer of the display region 100 includes multiple first light-emitting drive circuits and multiple common electrode lines (only one common electrode line 26 is illustrated in FIG. 8), wherein multiple the first light-emitting drive circuits and the multiple micro light-emitting elements are in one-to-one correspondence. A first light-emitting drive circuit may include multiple transistors and at least one storage capacitor. For example, the light-emitting drive circuit may be designed as 8T2C (i.e., eight thin film transistors and two capacitors) or 13T1C (i.e., thirteen thin film transistors and one capacitor). In FIG. 8, one first thin film transistor 101 and one first storage capacitor 104 are illustrated as an example. A micro light-emitting element 31 may include a light-emitting part, a first electrode and a second electrode which are connected to the light-emitting part. The first electrode is connected to a first end of the light-emitting part, and the second electrode is connected to a second end of the light-emitting part. In some examples, the first electrode of the micro light-emitting element 31 may be an anode and the second electrode may be a cathode. The display region 100 further includes multiple first connection electrodes and multiple second connection electrodes (only one first connection electrode 33 and one second connection electrode 34 are illustrated in FIG. 8). The first electrode of the micro light-emitting element 31 may be connected to a first drain electrode of the first thin film transistor 101 through the first connection electrode 33, and the second electrode of the micro light-emitting element 31 may be connected to the common electrode line 26 through the second connection electrode 34.

In some exemplary embodiments, as shown in FIG. 8, in a plane perpendicular to the display substrate, the ultrasonic sensing region 300 of the display substrate includes a base substrate 10, a first insulating layer 11, a second insulating layer 12, and a circuit structure layer which are sequentially disposed on the base substrate 10, multiple ultrasonic sensor elements disposed on the circuit structure layer (only two ultrasonic sensing elements are illustrated in FIG. 8), an adhesive layer 51 covering the multiple ultrasonic sensing elements, and a cover plate 52. The circuit structure layer of the ultrasonic sensing region 300 includes multiple ultrasonic detection circuits, which correspond to the multiple ultrasonic sensing elements one by one. An ultrasonic detection circuit may include multiple transistors, for example, it may be designed as 4T (i.e., four thin film transistors) or 5T (i.e., five thin film transistors). In FIG. 8, two ultrasonic detection circuits are taken as examples, and one second thin film transistor 102 is taken as example in each ultrasonic detection circuit. The circuit structure layer of the ultrasonic sensing region 300 may include: an active layer, a third insulating layer 13, a first gate metal layer, a fourth insulating layer 14, a fifth insulating layer 15, and a source and drain metal layer sequentially disposed on the second insulating layer 12. An ultrasonic sensing element may include a receive electrode 321, a piezoelectric functional layer 322 and a transmit electrode 323. The piezoelectric functional layer 322 may be configured to emit ultrasonic signals and receive an ultrasonic signal reflected by a sensing object (e.g., a finger). The receive electrode 321 may be disposed on a side of the piezoelectric functional layer 322 close to the base substrate 10, and the transmit electrode 323 may be disposed on a side of the piezoelectric functional layer 322 away from the base substrate 10. The transmit electrode 323 is in direct contact with the piezoelectric functional layer 322, and a seventh insulating layer 17 is provided between the receive electrode 321 and the piezoelectric functional layer 322. The receive electrode 321 may be connected to a second drain electrode of the second thin film transistor 102 of the ultrasonic detection circuit. The transmit electrode 323 may be connected to an ultrasonic control terminal (not shown in the figure) to receive an ultrasonic control signal sent by the ultrasonic control terminal.

In some exemplary embodiments, as shown in FIG. 8, in a plane perpendicular to the display substrate, the bonding region 400 of the display substrate includes a base substrate 10 and a first insulating layer 11, a second insulating layer 12, a third insulating layer 13, a fourth insulating layer 14, a fifth insulating layer 15, and multiple bonding electrodes (only one bonding electrode 41 is illustrated in FIG. 8) stacked on the base substrate 10. The multiple bonding electrodes are disposed on a same side of the base substrate 10 as the circuit structure layer, the micro light-emitting elements and the ultrasonic sensing elements. In some examples, the multiple bonding electrodes may be configured to: provide data signals and power signals to the first light-emitting drive circuits of the display region 100 through fan-out leads, provide various voltage signals to the ultrasonic detection circuits of the ultrasonic sensing region 300, provide ultrasonic control signals to the transmit electrode 323 of the ultrasonic sensing region 300, and to transmit fingerprint electrical signals detected by the ultrasonic detection circuits to an external circuit board. However, this is not limited in the present embodiment.

In some exemplary embodiments, a preparation process of the display substrate may include the following operations, as shown in FIGS. 9A to 9M.

(1) Preparing a Flexible Base Substrate on a Glass Carrier Plate and Preparing a Pattern of an Active Layer on the Base Substrate.

Figure 9A:
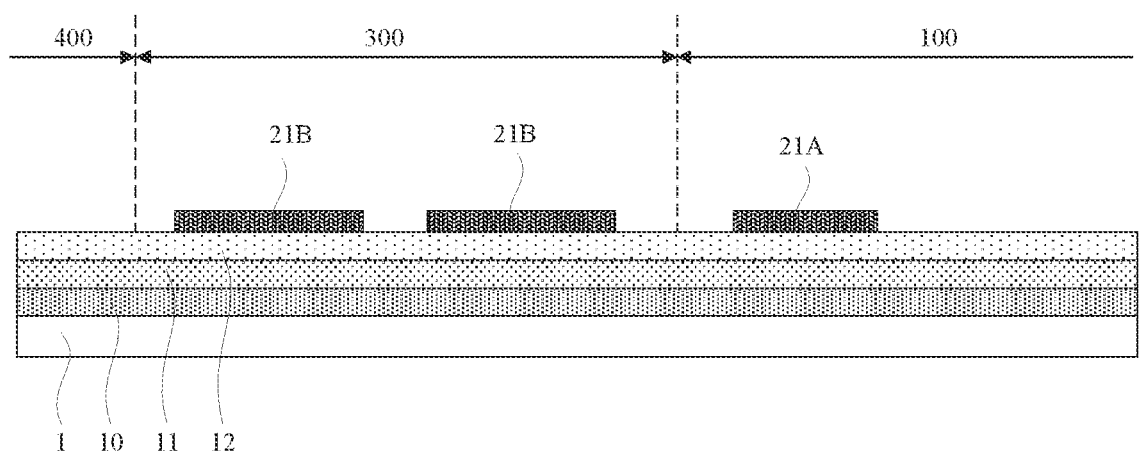
FIG. 9A is a schematic diagram of a display substrate after a pattern of an active layer is formed according to at least one embodiment of the present disclosure.

In some exemplary embodiments, an organic material (e.g., polyimide (PI), polyethylene terephthalate (PET) or a surface-treated polymer soft film, etc.) is coated on a glass carrier plate 1, and a base substrate 10 is formed through a patterning process, as shown in FIG. 9A.

In some exemplary embodiments, a first insulating thin film, a second insulating thin film and an active layer thin film are sequentially deposited on the base substrate 10 with the aforementioned structure formed, and the active layer thin film is patterned through a patterning process to form a first insulating layer 11 covering the entire base substrate 10, a second insulating layer 12 disposed on the first insulating layer 11 and a pattern of an active layer disposed on the second insulating layer 12. As shown in FIG. 9A, the pattern of the active layer is formed in the display region 100 and the ultrasonic sensing region 300, and includes at least a first active layer 21A and a second active layer 21B. The first active layer 21A is located in the display region 100, and the second active layer 21B is located in the ultrasonic sensing region 300.

After this patterning process, the bonding region 400 includes the base substrate 10, and the first insulating layer 11 and the second insulating layer 12 sequentially disposed on the base substrate 10.

(2) Preparing a Pattern of a First Gate Metal Layer on the Base Substrate.

Figure 9B:
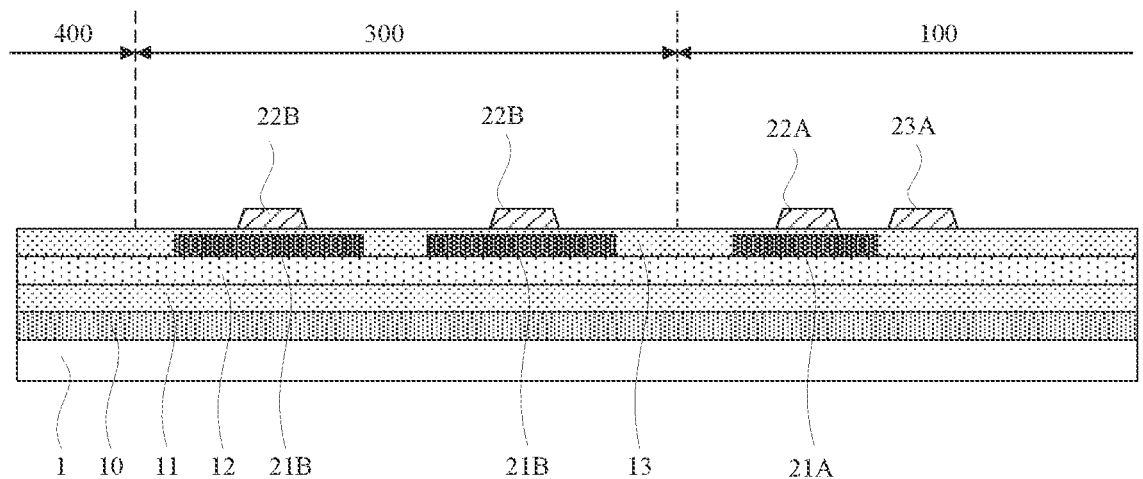
FIG. 9B is a schematic diagram of a display substrate after a pattern of a first gate metal layer is formed according to at least one embodiment of the present disclosure.

In some exemplary embodiments, a third insulating thin film and a first metal thin film are sequentially deposited on the base substrate 10 with the aforementioned structure formed, and the first metal thin film is patterned through a patterning process to form a third insulating layer 13 covering the pattern of the active layer and a pattern of a first gate metal layer disposed on the third insulating layer 13. As shown in FIG. 9B, the pattern of the first gate metal layer is formed in the display region 100 and the ultrasonic sensing region 300, and at least includes a first gate electrode 22A, a second gate electrode 22B, a first capacitor electrode 23A, multiple gate lines (not shown) and multiple gate leads (not shown). The first gate electrode 22A and the first capacitor electrode 23A are located in the display region 100, and the second gate electrode 22B is located in the ultrasonic sensing region 300.

After this patterning process, the bonding region 400 includes the base substrate 10, and the first insulating layer 11, the second insulating layer 12, and the third insulating layer 13 sequentially disposed on the base substrate 10.

(3) Preparing a Pattern of a Second Gate Metal Layer on the Base Substrate.

Figure 9C:
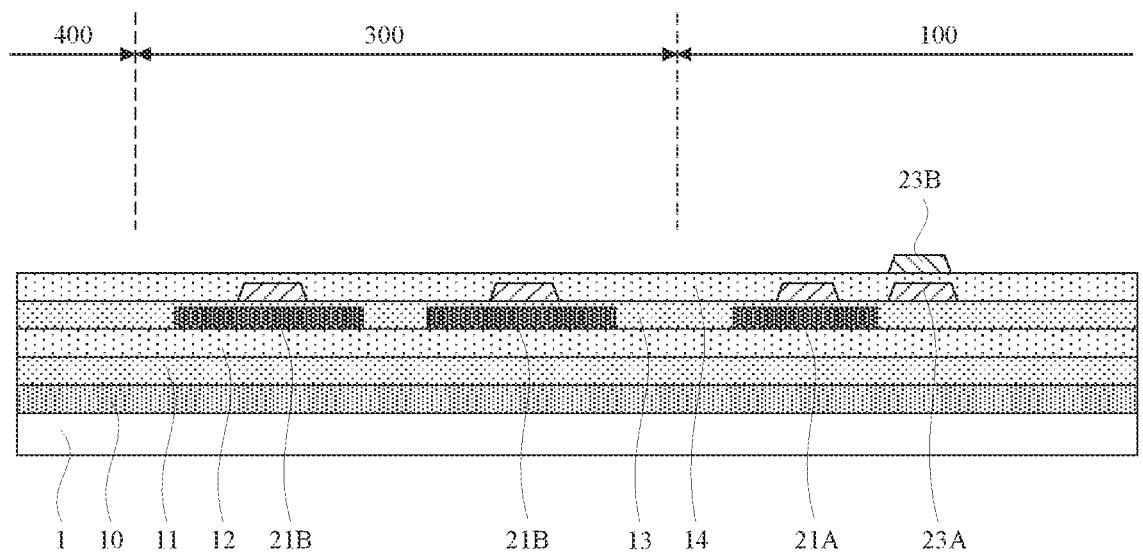
FIG. 9C is a schematic diagram of a display substrate after a second gate metal layer pattern is formed according to at least one embodiment of the present disclosure.

In some exemplary embodiments, a fourth insulating thin film and a second metal thin film are sequentially deposited on the base substrate 10 with aforementioned structure formed, and the second metal thin film is patterned through a patterning process to form a fourth insulating layer 14 covering the first gate metal layer and a pattern of a second gate metal layer disposed on the fourth insulating layer 14. As shown in FIG. 9C, the pattern of the second gate metal layer is formed in the display region 100, and at least includes a second capacitor electrode 23B, and position of the second capacitor electrode 23B corresponds to that of the first capacitor electrode 23A.

After this patterning process, the bonding region 400 includes the base substrate 10, and the first insulating layer 11, the second insulating layer 12, the third insulating layer 13, and the fourth insulating layer 14 sequentially disposed on the base substrate 10.

(4) Preparing a Pattern of a Fifth Insulating Layer on the Base Substrate.

Figure 9D:
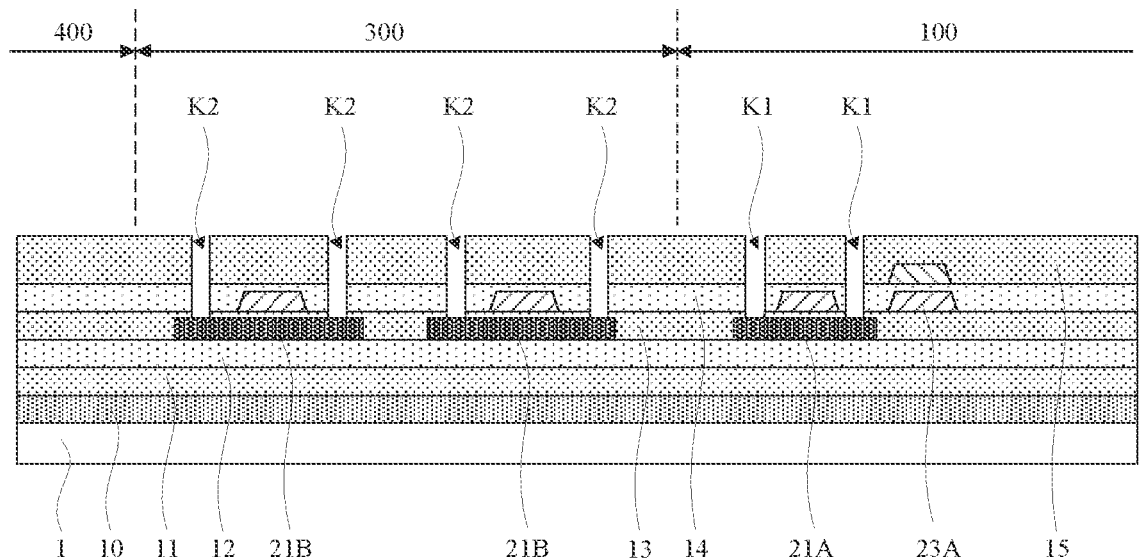
FIG. 9D is a schematic diagram of a display substrate after a pattern of a fifth insulating layer is formed according to at least one embodiment of the present disclosure.

In some exemplary embodiments, a fifth insulating thin film is deposited on the base substrate 10 with the aforementioned structure formed, and the fifth insulating thin film is patterned through a patterning process to form a pattern of a fifth insulating layer 15 covering the second gate metal layer. As shown in FIG. 9D, multiple first via holes K1 and multiple second via holes K2 are provided on the fifth insulating layer 15. Multiple first via holes K1 are formed in the display region 100, and positions of two first via holes K1 respectively correspond to positions of two ends of the first active layer 21A. The fifth insulating layer 15, the fourth insulating layer 14 and the third insulating layer 13 in any one of the first via holes K1 are etched off to expose a surface of the first active layer 21A. Multiple second via holes K2 are formed in the ultrasonic sensing region 300, and positions of two second via holes K2 correspond to two ends of the second active layer 21B. The fifth insulating layer 15, the fourth insulating layer 14 and the third insulating layer 13 in any one of the second via holes K2 are etched off to expose a surface of the second active layer 21B.

After this process, the bonding region 400 includes the base substrate 10, and the first insulating layer 11, the second insulating layer 12, the third insulating layer 13, the fourth insulating layer 14, and the fifth insulating layer 15 sequentially disposed on the base substrate 10.

(5) Prepare Bonding Electrodes and a Pattern of a Source and Drain Metal Layer on the Base Substrate.

Figure 9E:
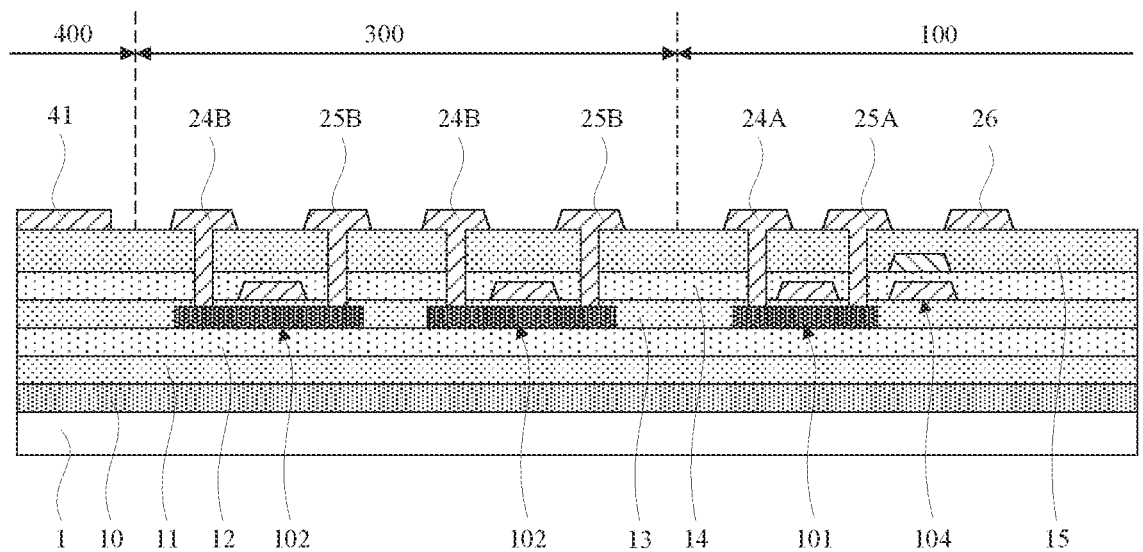
FIG. 9E is a schematic diagram of a display substrate after a pattern of a source and drain metal layer is formed according to at least one embodiment of the present disclosure.

In some exemplary embodiments, a third metal thin film is deposited on a base substrate 10 with the aforementioned structure formed, and the third metal thin film is patterned through a patterning process to form multiple bonding electrodes (only one bonding electrode 41 is illustrated in FIG. 9E) and a pattern of a source and drain metal layer on the fifth insulating layer 15. As shown in FIG. 9E, the pattern of the source and drain metal layer at least include a first source electrode 24A, a first drain electrode 25A and a common electrode line 26 formed in the display region 100, and a second source electrode 24B and a second drain electrode 25B formed in the ultrasonic sensing region 300. The bonding electrodes 41 are formed in the bonding region 400. The first source electrode 24A and the first drain electrode 25A are respectively connected to the first active layer 21A through the first via holes, and the second source electrode 24B and the second drain electrode 25B are respectively connected to the second active layer 21B through the second via holes.

In some examples, the source and drain metal layer may further include any one or more of a polarization line, a power supply line (VDD), a compensation line, and an auxiliary cathode. However, this is not limited in the present embodiment. In some examples, the polarization line may be configured to provide a charge release path for the display substrate during a subsequent polarization process. The polarization line may be disposed at an edge of the display substrate, and may be cut off during the subsequent cutting process of the display substrate.

At this point, the pattern of the circuit structure layer is prepared on the base substrate 10, as shown in FIG. 9E. In the display region 100, the first active layer 21A, the first gate electrode 22A, the first source electrode 24A and the first drain electrode 25A form a first thin film transistor 101, and the first capacitor electrode 23A and the second capacitor electrode 23B form a first storage capacitor 104. In some examples, the first thin film transistor 101 is, for example, the fourth transistor T4 in the first light-emitting drive circuit shown in FIG. 3, and the first storage capacitor 104 is, for example, the first capacitor C1 in the first light-emitting drive circuit shown in FIG. 3. In the ultrasonic sensing region 300, the second active layer 21B, the second gate electrode 22B, the second source electrode 24B, and the second drain electrode 25B form a second thin film transistor 102, and two second thin film transistors 102 are illustrated as an example in FIG. 9E. In some examples, the second thin film transistor 102 is, for example, the first switch transistor M1 in the ultrasonic detection circuit shown in FIG. 5. However, this is not limited in the present embodiment.

(6) Preparing a Sixth Insulating Layer on the Base Substrate.

Figure 9F:
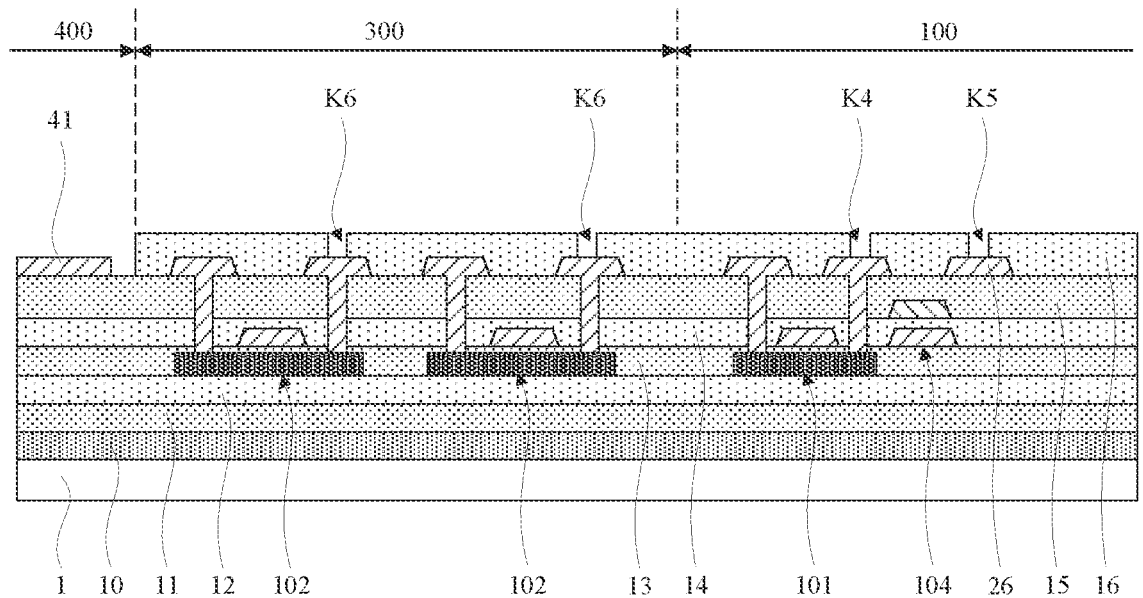
FIG. 9F is a schematic diagram of a display substrate after a pattern of a sixth insulating layer is formed according to at least one embodiment of the present disclosure.

In some exemplary embodiments, a sixth insulating thin film is deposited on the base substrate 10 with the aforementioned structure formed, and the sixth insulating film is patterned through a patterning process to form a pattern of a sixth insulating layer 16 covering the source and drain metal layer. As shown in FIG. 9F, the sixth insulating layer 16 of the display region 100 is provided with multiple fourth via holes and multiple fifth via holes (only one fourth via hole K4 and one fifth via hole K5 are illustrated in FIG. 9F). The sixth insulating layer 16 in the fourth via hole K4 is etched off to expose a surface of the first drain electrode of the first thin film transistor 101. The sixth insulating layer 16 in the fifth via hole K5 is etched off to expose the thin film of the common electrode line 26. The sixth insulating layer 16 of the ultrasonic sensing region 300 is provided with multiple sixth via holes K6. The sixth insulating layer 16 in a sixth via hole K6 is etched off to expose a surface of the second drain electrode of the second thin film transistor 102. The sixth insulating layer 16 of the bonding region 400 is etched off expose the surfaces of the bonding electrodes 41 and the fifth insulating layer 15.

(7) Preparing Patterns of Multiple Receive Electrodes, Multiple First Connection Electrodes and Multiple Second Connection Electrodes on the Base Substrate.

Figure 9G:
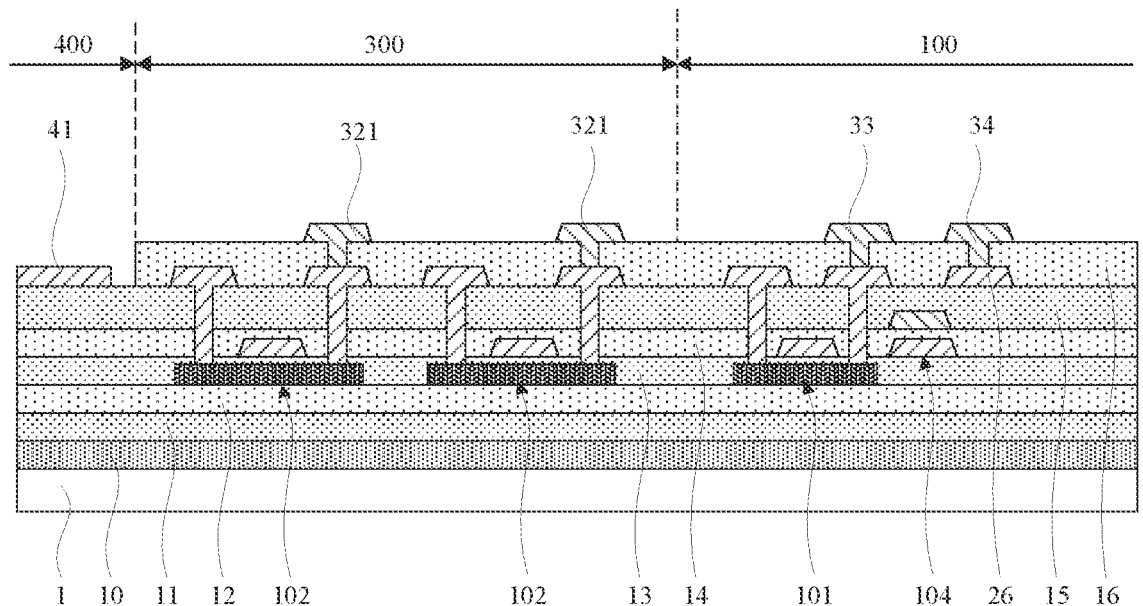
FIG. 9G is a schematic diagram of a display substrate after patterns of a receive electrode, a first connection electrode and a second connection electrode are formed according to at least one embodiment of the present disclosure.

In some exemplary embodiments, a fourth metal thin film is deposited on the base substrate 10 with the aforementioned structure formed, and the fourth metal thin film is patterned through a patterning process to form patterns of multiple receive electrodes, multiple first connection electrodes and multiple second connection electrodes (only two receive electrodes 321, one first connection electrode 33 and one second connection electrode 34 are illustrated in FIG. 9G). As shown in FIG. 9G, the receive electrodes 321 are formed in the ultrasonic sensing region 300, and the receive electrodes 321 are connected to the second drain electrodes of the second thin film transistors 102 through the sixth via holes K6. The first connection electrode 33 and the second connection electrode 34 are formed in the display region 100. The first connection electrode 33 is connected to the first drain electrode of the first thin film transistor 101 through the fourth via hole K4, and the second connection electrode 34 is connected to the common electrode line 26 through the fifth via hole K5.

After this patterning process, the film layer structures of the bonding region 400 do not change.

(8) Preparing a Seventh Insulating Layer on the Base Substrate, and Transferring the Micro Light-Emitting Element.

Figure 9H:
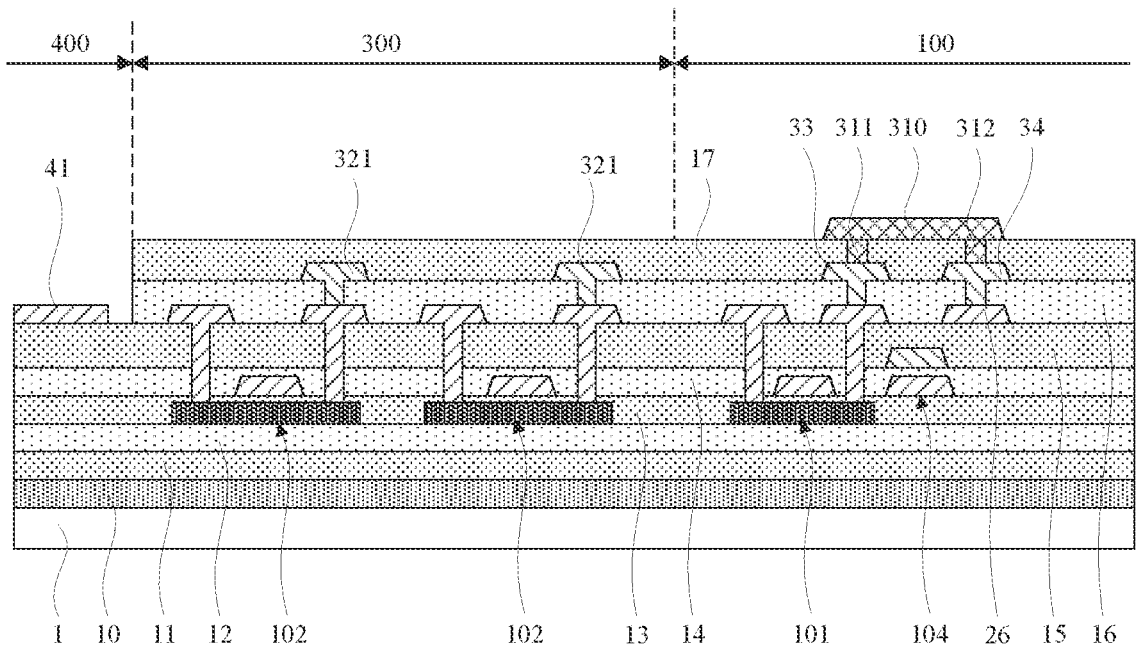
FIG. 9H is a schematic diagram of a display substrate after micro light-emitting elements are formed according to at least one embodiment of the present disclosure.

In some exemplary embodiments, a seventh insulating thin film is deposited on the base substrate 10 with the aforementioned structure formed, and the seventh insulating thin film is patterned through a patterning process to form a pattern of a seventh insulating layer 17. As shown in FIG. 9H, the seventh insulating layer 17 forms multiple first grooves and multiple second grooves in the display region 100 (only one first groove and one second groove are illustrated in FIG. 9H). The seventh insulating layer 17 in the first groove is etched off to expose a surface of the first connection electrode 33. The seventh insulating layer 17 in the second groove is etched off to expose a surface of the second connection electrode 34.

In some exemplary embodiments, the micro light-emitting element is a Micro-LED. The micro light-emitting element includes a first electrode 311, a second electrode 312 and a light-emitting part 310. The first electrode 311 is connected to a first end of the light-emitting part 310, and the second electrode 312 is connected to a second end of the light-emitting part 310. In some examples, the first electrode 311 may be an anode and the second electrode 312 may be a cathode. However, this is not limited in the present embodiment. In some examples, adding a bonding material (e.g., solder paste) into the first groove and the second groove by a dispensing machine in a vacuum environment, the bonding of the micro light-emitting element is completed by a transfer process. The first electrode 311 of the micro light-emitting element is bonded and connected to the first connection electrode 33 through the bonding material in the first groove, and the second electrode 312 is bonded and connected to the second connection electrode 34 through the bonding material in the second groove. In this way, the first electrode 311 of the micro light-emitting element is connected to the first drain electrode of the first thin film transistor 101 through the first connection electrode 33, and the second electrode 312 is connected to the common electrode line 26 through the second connection electrode 34.

After this patterning process, the film layer structures of the bonding region 400 do not change.

(9) Preparing a Transparent Organic Insulating Layer on the Base Substrate.

Figure 9I:
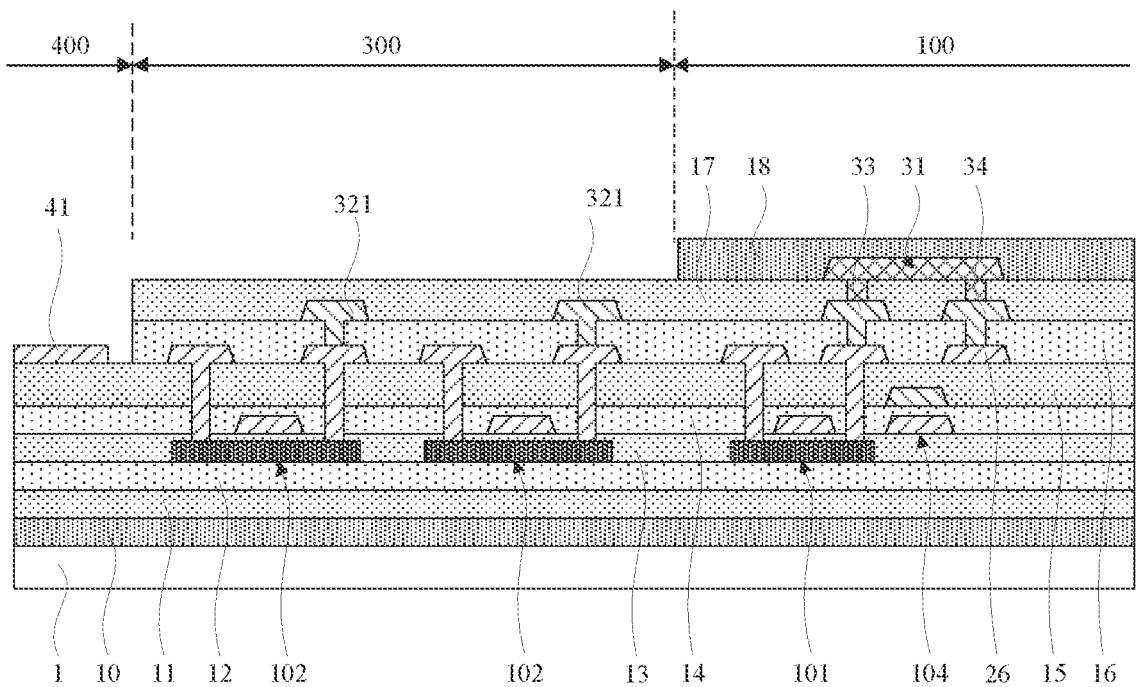
FIG. 9I is a schematic diagram of a display substrate after a pattern of a transparent organic insulating layer are formed according to at least one embodiment of the present disclosure.

In some exemplary embodiments, a transparent organic insulating thin film is coated on the base substrate 10 with the aforementioned structure formed, and the transparent organic insulating thin film is patterned through a patterning process to form a pattern of a transparent organic insulating layer 18. As shown in FIG. 9I, the transparent organic insulating layer 18 may cover the display region 100, and the ultrasonic sensing region 300 and the bonding region 400 are not provided with the transparent organic insulating layer 18.

In some examples, the transparent organic insulating layer 18 may be made of polyimide (PI), acrylic or polyethylene terephthalate.

In this exemplary embodiment, the transparent organic insulating layer covers the multiple micro light-emitting elements, so that the micro light-emitting elements can be encapsulated and protected without reducing the light transmittance (for example, the light transmittance can be greater than 90%) of light emitted from the micro light-emitting elements.

After this patterning process, the film layer structures of the bonding region 400 do not change.

(10) Preparing a Piezoelectric Functional Layer on the Base Substrate.

Figure 9J:
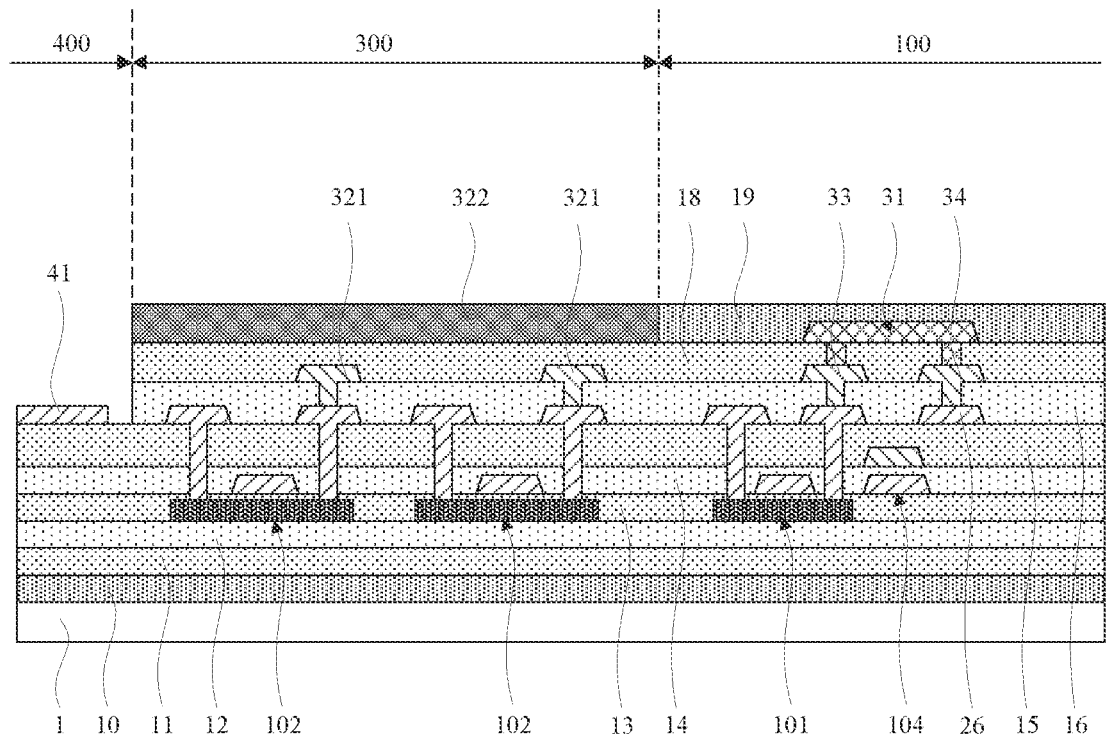
FIG. 9J is a schematic diagram of a display substrate after a pattern of a piezoelectric functional layer are formed according to at least one embodiment of the present disclosure.

In some exemplary embodiments, a piezoelectric material is coated on the base substrate 10 with the aforementioned structure formed to form a pattern of a piezoelectric functional layer 322. As shown in FIG. 9J, the piezoelectric functional layer 322 is formed in the ultrasonic sensing region 300. A thickness of the piezoelectric functional layer 322 may be approximately equal to a thickness of the transparent organic insulating layer 18. In some examples, an absolute value of difference between the thickness of the transparent organic insulating layer 18 and the thickness of the piezoelectric functional layer 322 may be less than 1 micrometer.

In some examples, the piezoelectric material may be polyvinylidene fluoride (PVDF), piezoelectric ceramic, electret, etc. However, this is not limited in the present embodiment.

Figure 9K:
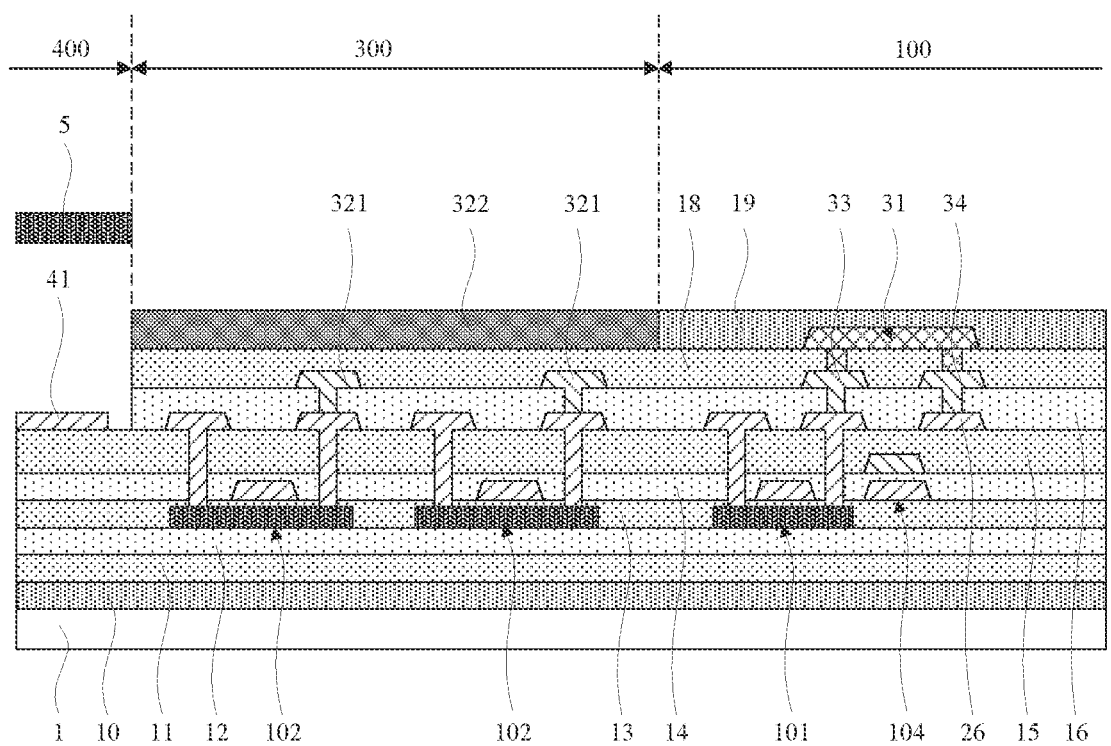
FIG. 9K is a schematic diagram of polarization treatment on a piezoelectric functional layer according to at least one embodiment of the present disclosure.

In some exemplary embodiments, as shown in FIG. 9K, when polarizing the piezoelectric functional layer 322 (for example, applying a strong DC electric field to the piezoelectric functional layer), an insulating mask 5 is used to shield the bonding region 400, the display region 100 is covered by the transparent organic insulating layer 18, and the ultrasonic sensing region 300 is covered by the piezoelectric functional layer 322. In this way, during the polarization process, the mask 5, the transparent organic insulating layer 18 and the piezoelectric functional layer 322 may be used to protect the circuit structure of the display substrate, thereby preventing the thin film transistors from being damaged or penetrated by the polarization electric field.

After this process, the film layer structures of the display region 100 and the bonding region 400 do not change.

(11) Preparing a Pattern of a Transmit Electrode Layer on the Base Substrate.

Figure 9L:
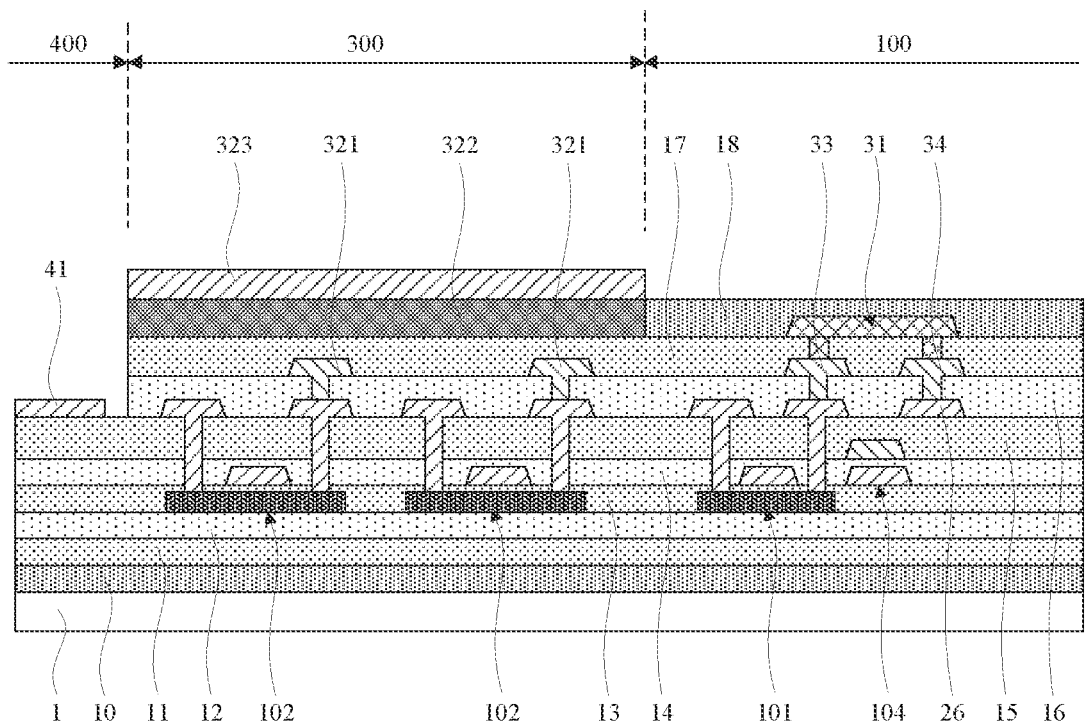
FIG. 9L is a schematic diagram of a display substrate after a pattern of an transmit electrode layer is formed according to at least one embodiment of the present disclosure.

In some exemplary embodiments, a fifth metal thin film is deposited on the base substrate 10 with the aforementioned structure formed, and a pattern of a transmit electrode layer is formed through a patterning process (for example, preparing a transmit electrode layer through an electroplating process or silver paste screen printing). As shown in FIG. 9L, the transmit electrode layer is formed in the ultrasonic sensing region 300, and includes a sheet transmit electrode 323, wherein the transmit electrode 323 is in direct contact with the piezoelectric functional layer 322. After this process, the film layer structures of the bonding region 400 do not change.

(12) Preparing a Cover Plate on the Base Substrate.

Figure 9M:
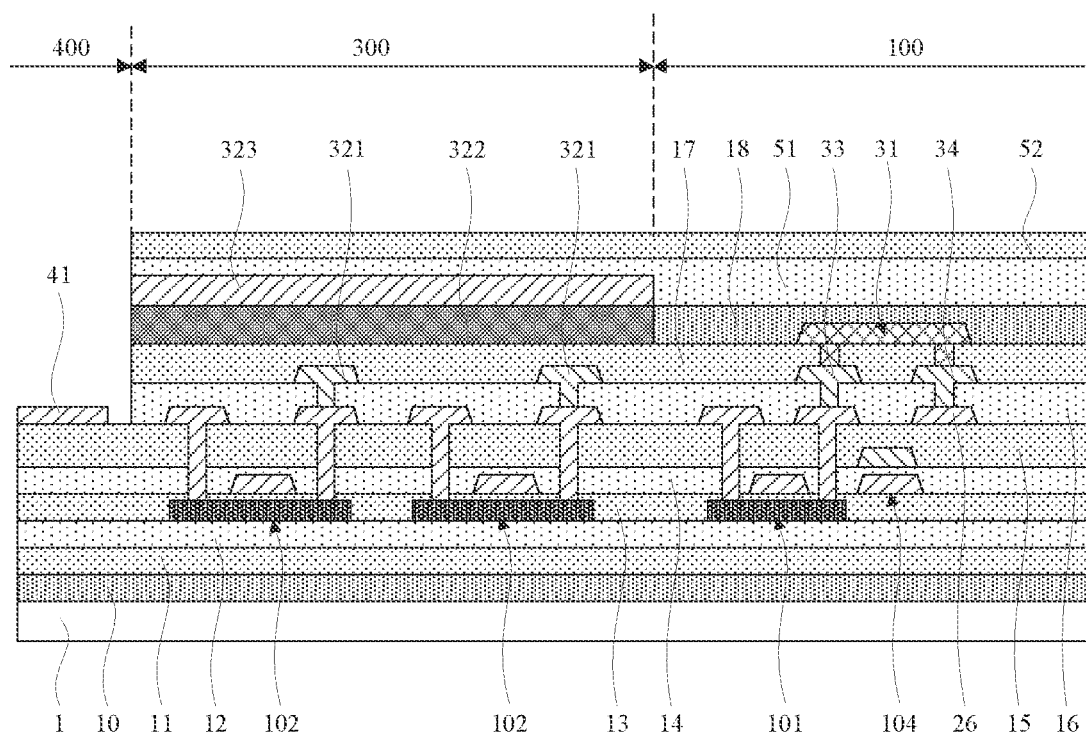
FIG. 9M is a schematic diagram of a display substrate after a cover plate is formed according to at least one embodiment of the present disclosure.

In some exemplary embodiments, an adhesive layer 51 is formed by optical clear adhesive (OCA) on the base substrate 10 with the aforementioned structure formed, and a cover plate 52 (for example, a glass cover plate) is attached to the adhesive layer 51. As shown in FIG. 9M, the cover plate 52 may cover the display region 100 and the ultrasonic sensing region 300. After this process, the film layer structures of the bonding region 400 do not change.

After the above film layer structures are prepared, the display substrate is firstly peeled off from the glass carrier 1 by a peeling process. In this exemplary embodiment, the bonding electrodes and the circuit structure layer are disposed on the same side of the display substrate (for example, a front surface of the display substrate). The bonding electrodes disposed on the front surface of the display substrate may be bound and connected to the flexible circuit board, and the flexible circuit board may be bent to a back surface of the display substrate to avoid affecting conduction of ultrasonic waves.

In some exemplary embodiments, the first insulating thin film, the second insulating thin film, the third insulating thin film, the fourth insulating thin film, the fifth insulating thin film, the sixth insulating thin film, and the seventh insulating thin film may be made of any one or more of silicon oxide (SiOx), silicon nitride (SiNx) and silicon oxynitride (SiON), and may be a single layer, multiple layers or a composite layer. The first insulating layer 11 is called a barrier layer, which is used to improve the water and oxygen resistance of the base substrate. The second insulating layer 12 is called a buffer layer, which is used to improve the water and oxygen resistance of the base substrate. The third insulating layer 13 and the fourth insulating layer 14 are called gate insulator (GI) layers, and the fifth insulating layer 15 is called an interlayer dielectric (ILD) layer, and the sixth insulating layer 16 and the seventh insulating layer 17 are called passivation (PVX) layers. The first metal thin film, the second metal thin film, the third metal thin film, the fourth metal thin film and the fifth metal thin film may be made of metal materials, such as any one or more of silver (Ag), copper (Cu), aluminum (Al) and molybdenum (Mo), or an alloy material of the above metals, such as AlNd alloy or MoNb alloy, which may have a single-layer structure or a multi-layer composite structure, such as Mo/Cu/Mo. The active layer thin film may be made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organic technology.

In this exemplary embodiment, the first light-emitting drive circuits and the ultrasonic detection circuits may be integrated in the circuit structure layer, and an orthographic projection of the ultrasonic sensing elements on the base substrate does not overlap with an orthographic projection of and the micro light-emitting elements on the base substrate, which can reduce the thickness of the display substrate and contributes to lightness of the display product. In addition, ultrasonic signals do not need to pass through the circuit structure, which can reduce loss of the ultrasonic signals, thereby improving the signal-to-noise ratio and the ultrasonic detection effect. Furthermore, during the polarization process of the piezoelectric functional layer, the display region, the ultrasonic sensing region and the bonding region are protected by the transparent organic insulating layer, the piezoelectric functional layer and the mask respectively, so that the transistors of the circuit structure layer can be prevented from being damaged or penetrated by the polarized electric field.

The structure and preparation process of the of display substrate shown in this exemplary embodiment are merely illustrative. In some exemplary embodiment, according to actual needs, corresponding structures may be changed and patterning processes may be added or reduced. For example, the first connection electrode and the second connection electrode may be omitted. The first electrode of the micro light-emitting element may be directly connected to the first drain electrode of the first thin film transistor, and the second electrode of the micro light-emitting element may be directly connected to the common electrode line. For another example, the driving transistor may have a top gate structure, a bottom gate structure, or a single gate structure, or a dual gate structure. However, this is not limited in the present embodiment.

The structure (or method) shown in the present embodiment may be appropriately combined with the structure (or method) shown in another embodiment.

Figure 10:
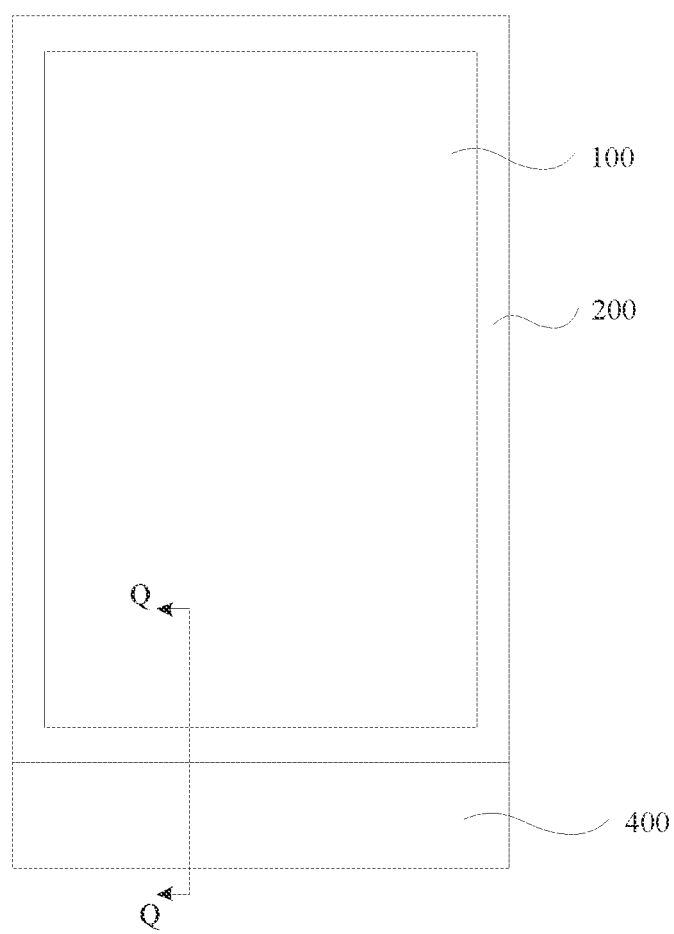
FIG. 10 is another schematic diagram of a display substrate according to at least one embodiment of the present disclosure.

FIG. 10 is another schematic diagram of a display substrate according to at least one embodiment of the present disclosure. As shown in FIG. 10, the display substrate according to this exemplary embodiment includes a display region 100, a peripheral region 200 located around the display region 100, and a bonding region 400 located on a side away from the display region 100. The display region 100 is provided therein with multiple micro light-emitting elements and multiple ultrasonic sensing elements disposed regularly. The multiple micro light-emitting elements and the multiple ultrasonic sensing elements may correspond to each other one by one. For example, display function and fingerprint recognition function are integrated in the entire display region 100. In some examples, a micro light-emitting element may be a Micro-LED or a Mini-LED. The bonding region 400 is provided with multiple bonding electrodes which are bonded and connected to an external circuit board (e.g. a flexible printed circuit). However, this is not limited in the present embodiment. In some examples, some of the micro light-emitting elements in the display region 100 may correspond to multiple ultrasonic sensing elements one by one, and the rest of the micro light-emitting elements may be disposed independently. In other words, the display function and the fingerprint recognition function are integrated in a part of the display region 100, and the remaining regions only have the display function.

Figure 11:
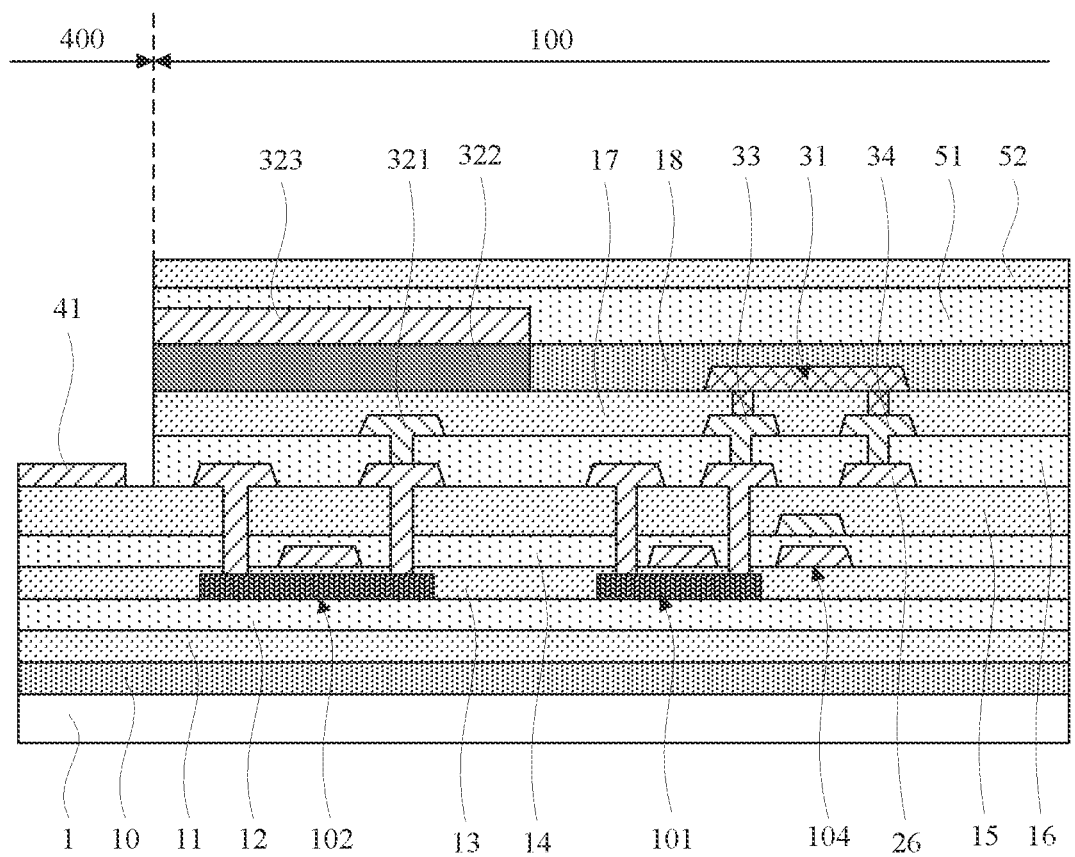
FIG. 11 is a schematic sectional view along Q-Q direction in FIG. 10.

FIG. 11 is a schematic sectional view along Q-Q direction in FIG. 10. As shown in FIG. 11, in a plane perpendicular to the display substrate, the display region 100 of the display substrate includes: a base substrate 10, a first insulating layer 11, a second insulating layer 12 and a circuit structure layer which are sequentially disposed on the base substrate 10, multiple micro light-emitting elements and multiple ultrasonic sensing elements (only one micro light-emitting element 31 and one ultrasonic sensing element is illustrated in FIG. 11) disposed on the circuit structure layer, a transparent organic insulating layer 18 covering the multiple micro light-emitting elements, an adhesive layer 51 covering the transparent organic insulating layer 18, and a cover plate. The multiple micro light-emitting elements and the multiple ultrasonic sensing elements may be disposed adjacently in one-to-one correspondence.

In some exemplary embodiments, the circuit structure layer includes multiple second light-emitting drive circuits having an ultrasonic detection function, wherein the multiple second light-emitting drive circuits are connected to multiple ultrasonic sensing elements and multiple micro light-emitting elements in one-to-one correspondence. That is, a light-emitting driving function and an ultrasonic detection function are integrated in the second light-emitting drive circuits. However, this is not limited in the present embodiment. In some examples, the circuit structure layer may include multiple first light-emitting drive circuits and multiple ultrasonic detection circuits, wherein the multiple first light-emitting drive circuits are connected to multiple micro light-emitting elements in one-to-one correspondence, and the multiple ultrasonic detection circuits are connected to multiple ultrasonic sensing elements in one-to-one correspondence. That is, the first light-emitting drive circuits achieve the light-emitting driving function, and the ultrasonic detection circuits achieve the ultrasonic detection function.

In some exemplary embodiments, as shown in FIG. 11, the circuit structure layer of the display region 100 may include: an active layer, a third insulating layer 13, a first gate metal layer, a fourth insulating layer 14, a second gate metal layer, a fifth insulating layer 15, and a source and drain metal layer sequentially disposed on the second insulating layer 12. The active layer at least includes a first active layer and a second active layer. The first gate metal layer may at least include a first gate electrode, a second gate electrode and a first capacitor electrode. The second gate metal layer may at least include a second capacitor electrode. The source and drain metal layer may at least include a first source electrode, a first drain electrode, a second source electrode, a second drain electrode and a common electrode line 26. The first active layer, the first gate electrode, the first source electrode and the first drain electrode form a first thin film transistor 101, and the first capacitor electrode and the second capacitor electrode form a first storage capacitor 104. The second active layer, the second gate electrode, the second source electrode and the second drain electrode form the second thin film transistor 102. The first thin film transistor 101 and the second thin film transistor 102 may be transistors in a same second light-emitting drive circuit.

In some exemplary embodiments, as shown in FIG. 11, in a plane perpendicular to the display substrate, the bonding region 400 of the display substrate may include a base substrate 10 and a first insulating layer 11, a second insulating layer 12, a third insulating layer 13, a fourth insulating layer 14, a fifth insulating layer 15 which are stacked on the base substrate 10, and multiple bonding electrodes (only one bonding electrode 41 is illustrated in FIG. 11). In this exemplary embodiment, the multiple bonding electrodes are located on the same side of the base substrate 10 as the circuit structure layer. However, this is not limited in the present embodiment. In some examples, the multiple bonding electrodes may be disposed on a different side of the base substrate from the circuit structure layer, for example, the bonding electrodes may be disposed on the back surface of the base substrate.

In some exemplary embodiments, as shown in FIG. 11, a micro light-emitting element 31 may include a light-emitting part, a first electrode and a second electrode connected to the light-emitting part. The first electrode is connected to a first end of the light-emitting part, and the second electrode is connected to a second end of the light-emitting part. In some examples, the first electrode of the micro light-emitting element 31 may be an anode and the second electrode may be a cathode. The first electrode of the micro light-emitting element 31 may be connected to a first drain electrode of the first thin film transistor 101 through the first connection electrode 33, and the second electrode of the micro light-emitting element 31 may be connected to the common electrode line 26 through the second connection electrode 34. An ultrasonic sensing elements may include a receive electrode 321, a piezoelectric functional layer 322 and a transmit electrode 323. The receive electrode 321 and the first connection electrode 33 and the second connection electrode 34 of the display region 100 may be disposed in a same layer. The receive electrode 321 is located on a side of the piezoelectric functional layer 322 close to the base substrate 10, and the transmit electrode 323 is located on a side of the piezoelectric functional layer 322 away from the base substrate 10. The transmit electrode 323 is in direct contact with the piezoelectric functional layer 322, and a seventh insulating layer 17 is provided between the receive electrode 321 and the piezoelectric functional layer 322.

Other structures of this embodiment may be referred to the descriptions of the above embodiments and will not be further illustrated here.

The structure (or method) shown in the present embodiment may be appropriately combined with the structure (or method) shown in another embodiment.

At least one embodiment of the present disclosure further provides a method for preparing a display substrate, which includes: forming a circuit structure layer on a base substrate; and forming multiple micro light-emitting elements and multiple ultrasonic sensing elements on a side of circuit structure layer away from the base substrate. Here, multiple micro light-emitting elements are electrically connected to the circuit structure layer, and multiple ultrasonic sensing elements are electrically connected to the circuit structure layer. An orthographic projection of the multiple ultrasonic sensing elements on the base substrate does not overlap with an orthographic projection of the multiple micro light-emitting elements on the base substrate.

In some exemplary embodiments, the above method further includes: forming a transparent organic insulating layer covering the multiple micro light-emitting elements on a side of the multiple micro light-emitting elements away from the base substrate. Here, each of the multiple ultrasonic sensing elements includes a piezoelectric functional layer. The transparent organic insulating layer is in direct contact with the piezoelectric functional layer of the ultrasonic sensing element, and an orthographic projection of the transparent organic insulating layer on the base substrate does not overlap with an orthographic projection of the piezoelectric functional layers of the multiple ultrasonic sensing elements on the base substrate.

In some exemplary embodiments, forming multiple micro light-emitting elements on a side of the circuit structure layer away from the base substrate includes: forming multiple first connection electrodes, multiple second connection electrodes and receive electrodes of multiple ultrasonic sensing elements on the side of the circuit structure layer away from the base substrate; forming the multiple micro light-emitting elements on a side of the multiple first connection electrodes and the multiple second connection electrodes away from the base substrate through a transfer process; forming the piezoelectric functional layers of the ultrasonic sensing elements on a side of multiple receive electrodes away from the base substrate; and forming transmit electrodes of the multiple ultrasonic sensing elements on a side of the piezoelectric functional layer away from the base substrate. Here, the multiple first connection electrodes, the multiple second connection electrodes and the receive electrodes are connected to the circuit structure layer. A first electrode of at least one micro light-emitting element is electrically connected to a first connection electrode, and a second electrode is electrically connected to a second connection electrode.

In some exemplary embodiments, forming the piezoelectric functional layers of the multiple ultrasonic sensing elements on the side of the receive electrodes of the multiple ultrasonic sensing elements away from the base substrate includes: performing self-aligned polarization treatment on the piezoelectric functional layers using the transparent organic insulating layer; or, polarizing the piezoelectric functional layers using a mask and the transparent organic insulating layer.

In some exemplary embodiments, the above preparation method further includes forming multiple bonding electrodes on a de-bonding layer; forming the base substrate on a side of the multiple bonding electrodes away from the de-bonding layer; and forming a fan-out lead layer on the base substrate. The fan-out lead layer includes multiple fan-out leads, and at least one of the multiple fan-out leads is connected to at least one of the bonding electrodes through a via hole penetrating through the base substrate.

In some exemplary embodiments, forming the circuit structure layer on the base substrate includes: sequentially forming an active layer, a first gate insulating layer, a first gate metal layer, a second gate insulating layer, a second gate metal layer, an interlayer dielectric layer and a source and drain metal layer on the base substrate.

Preparation method of this embodiment may be referred to the descriptions of the aforementioned embodiments and will not be further illustrated here.

Figure 12:
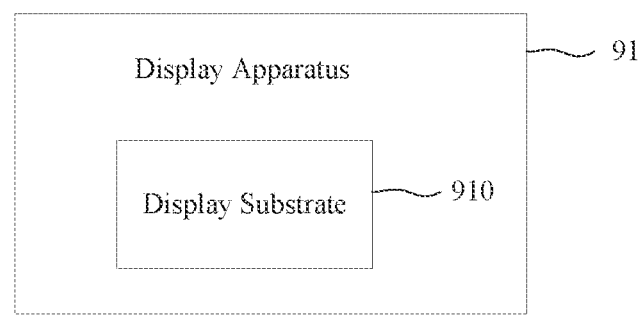
FIG. 12 is a schematic diagram of a display apparatus according to at least one embodiment of the present disclosure.

FIG. 12 is a schematic diagram of a display apparatus according to at least one embodiment of the present disclosure. As shown in FIG. 12, this embodiment provides a display apparatus 91, which includes a display substrate 910. The display substrate 910 is the display substrate provided in the previous embodiments. The display substrate 910 may be a micro-LED display substrate or a mini-LED display substrate. The display apparatus 91 may be any product or component that has a display function and an ultrasonic detection function (for example, a fingerprint recognition function), such as a mobile phone, a tablet computer, a TV, a display, a laptop computer, a digital photo frame, and a navigator. However, this is not limited in the present embodiment.

The accompanying drawings in the present disclosure only refer to the structures involved in the present disclosure, and common designs may be referred to for other structures. The embodiments of the present disclosure and the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be contained within the scope of the claims of the present disclosure.

What is claimed is:

1. A display substrate, comprising:
   a base substrate;
   a circuit structure layer disposed on the base substrate;
   a plurality of ultrasonic sensing elements, which are disposed on a side of the circuit structure layer away from the base substrate, and are electrically connected to the circuit structure layer; and
   a micro light-emitting element, which is disposed on the side of the circuit structure layer away from the base substrate, and is electrically connected to the circuit structure layer;
   wherein an orthographic projection of the plurality of ultrasonic sensing elements on the base substrate does not overlap with an orthographic projection of the micro light-emitting element on the base substrate, and the plurality of ultrasonic sensing elements and the micro light-emitting element are disposed side by side, so that an ultrasonic signal does not pass through the circuit structure layer;

the display substrate further comprises: a transparent organic insulating layer disposed on a side of the micro light-emitting element away from the base substrate, wherein the transparent organic insulating layer covers the micro light-emitting element;

each of the plurality of ultrasonic sensing elements comprises a piezoelectric functional layer;

the transparent organic insulating layer is in direct contact with the piezoelectric functional layers of the plurality of ultrasonic sensing elements, and an orthographic projection of the transparent organic insulating layer on the base substrate does not overlap with an orthographic projection of the piezoelectric functional layers of the plurality of ultrasonic sensing elements on the base substrate;

wherein at least one ultrasonic sensing element of the plurality of ultrasonic sensing elements further comprises: a transmit electrode and a receive electrode; the transmit electrode is located on a side of the piezoelectric functional layer away from the base substrate; the receive electrode is located on a side of the piezoelectric functional layer close to the base substrate and is electrically connected to the circuit structure layer;

wherein the transmit electrode is in direct contact with the piezoelectric functional layer, and an insulating layer is disposed between the receive electrode and the piezoelectric functional layer.

2. The display substrate according to claim 1, wherein the circuit structure layer comprises a first light-emitting drive circuit and a plurality of ultrasonic detection circuits; the plurality of ultrasonic detection circuits are connected to the plurality of ultrasonic sensing elements in one-to-one correspondence; and the first light-emitting drive circuit is connected to the micro light-emitting element; or, the circuit structure layer comprises a plurality of second light-emitting drive circuits having an ultrasonic detection function, wherein the plurality of second light-emitting drive circuits are connected to the plurality of ultrasonic sensing elements in one-to-one correspondence and the plurality of second light-emitting drive circuits are connected to the micro light-emitting element.

3. The display substrate according to claim 2, wherein the circuit structure layer further comprises a common electrode;

the micro light-emitting element comprises a light-emitting part, and a first electrode and a second electrode which are connected to the light-emitting part; the first electrode is electrically connected to a corresponding first light-emitting drive circuit or a corresponding second light-emitting drive circuit, and the second electrode is electrically connected to a common electrode line.

4. The display substrate according to claim 3, further comprising: a first connection electrode and a second connection electrode; the first electrode of the micro light-emitting element is electrically connected to the corresponding first light-emitting drive circuit or the corresponding second light-emitting drive circuit through the first connection electrode, and the second electrode of the micro light-emitting element is electrically connected to the common electrode line through the second connection electrode.

5. The display substrate according to claim 4, wherein the first connection electrode and the second connection electrode and the receive electrode of the at least one ultrasonic sensing element are disposed in a same layer.

6. The display substrate according to claim 1, wherein the base substrate comprises a display region and an ultrasonic sensing region located on a side of the display region; the plurality of ultrasonic sensing elements are located in the ultrasonic sensing region, and the micro light-emitting element is located in the display region.

7. The display substrate according to claim 6, wherein the base substrate further comprises a bonding region located on a side of the display region; the bonding region comprises a plurality of bonding electrodes; the plurality of bonding electrodes and the circuit structure layer are located on a same side of the base substrate, or the plurality of bonding electrodes and the circuit structure layer are located on different sides of the base substrate.

8. The display substrate according to claim 7, wherein the plurality of bonding electrodes and the circuit structure layer are located on different sides of the base substrate, and the bonding region further comprises a fan-out lead layer located on the same side of the base substrate as the circuit structure layer; the fan-out lead layer comprises a fan-out lead, and the fan-out lead is connected to at least one of the bonding electrodes through a via hole penetrating through the base substrate.

9. The display substrate according to claim 7, wherein the circuit structure layer comprises an active layer, a first gate metal layer, a second gate metal layer and a source and drain metal layer which are sequentially disposed on the base substrate.

10. The display substrate according to claim 9, wherein the plurality of bonding electrodes and the circuit structure layer are located on the same side of the base substrate, and the plurality of bonding electrodes and the source and drain metal layer are disposed in a same layer.

11. A display apparatus, comprising the display substrate according to claim 1.

12. A method for preparing a display substrate, comprising:

forming a circuit structure layer on a base substrate; and forming a micro light-emitting element and a plurality of ultrasonic sensing elements on a side of the circuit structure layer away from the base substrate; wherein the micro light-emitting element is electrically connected to the circuit structure layer and the plurality of ultrasonic sensing elements are electrically connected to the circuit structure layer, and an orthographic projection of the plurality of ultrasonic sensing elements on the base substrate does not overlap with an orthographic projection of the micro light-emitting element on the base substrate, and the plurality of ultrasonic sensing elements and the micro light-emitting element are disposed side by side, so that an ultrasonic signal does not pass through the circuit structure layer;

wherein the method is used for preparing the display substrate according to claim 1.

13. The preparation method according to claim 12, further comprising: forming a transparent organic insulating layer covering the micro light-emitting element on a side of the micro light-emitting element away from the base substrate;

wherein each of the plurality of ultrasonic sensing elements comprises a piezoelectric functional layer; the transparent organic insulating layer is in direct contact with the piezoelectric functional layer of the ultrasonic sensing element, and an orthographic projection of the transparent organic insulating layer on the base substrate does not overlap with an orthographic projection of the piezoelectric functional layers of the plurality of ultrasonic sensing elements on the base substrate.

14. The preparation method according to claim 13, wherein forming the micro light-emitting element and the plurality of ultrasonic sensing elements on the side of the circuit structure layer away from the base substrate comprises:

forming a first connection electrode, a second connection electrode and receive electrodes of the plurality of ultrasonic sensing elements on the side of the circuit structure layer away from the base substrate, wherein the first connection electrode, the second connection electrode and the receive electrodes are connected to the circuit structure layer;

forming a micro light-emitting element on a side of the first connection electrode and the second connection electrode away from the base substrate through a transfer process; wherein a first electrode of the micro light-emitting element is electrically connected to a first connection electrode, and a second electrode of the micro light-emitting element is electrically connected to a second connection electrode;

forming the piezoelectric functional layers of the plurality of ultrasonic sensing elements on a side of the receive electrodes of the plurality of ultrasonic sensing elements away from the base substrate; and forming transmit electrodes of the plurality of ultrasonic sensing elements on a side of the piezoelectric functional layers away from the base substrate.

15. The preparation method according to claim 14, wherein forming the piezoelectric functional layers of the plurality of ultrasonic sensing elements on the side of the receive electrodes of the plurality of ultrasonic sensing elements away from the base substrate comprises:

performing self-aligned polarization treatment on the piezoelectric functional layers using the transparent organic insulating layer; or, polarizing the piezoelectric functional layers using a mask and the transparent organic insulating layer.

16. The preparation method according to claim 12, further comprising:

forming a plurality of bonding electrodes on a de-bonding layer;

forming the base substrate on a side of the plurality of bonding electrodes away from the de-bonding layer; and forming a fan-out lead layer on the base substrate, wherein the fan-out lead layer comprises a fan-out lead, and the fan-out lead is connected to at least one of the bonding electrodes through a via hole penetrating through the base substrate.

17. The preparation method according to claim 12, wherein forming the circuit structure layer on the base substrate comprises:

sequentially forming an active layer, a first gate metal layer, a second gate metal layer, and a source and drain metal layer on the base substrate.

* * * * *